United States Patent
Kang et al.

(10) Patent No.: US 11,271,045 B2
(45) Date of Patent: Mar. 8, 2022

(54) ELECTROLUMINESCENT DISPLAY DEVICE

(71) Applicant: LG Display Co., Ltd., Seoul (KR)

(72) Inventors: Yeonsuk Kang, Paju-si (KR); YoungMi Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 404 days.

(21) Appl. No.: 16/523,114

(22) Filed: Jul. 26, 2019

(65) Prior Publication Data
US 2020/0035758 A1    Jan. 30, 2020

(30) Foreign Application Priority Data
Jul. 27, 2018    (KR) .......................... 10-2018-0088043

(51) Int. Cl.
| | |
|---|---|
| *H01L 27/32* | (2006.01) |
| *H01L 51/52* | (2006.01) |
| *G02B 27/01* | (2006.01) |
| *G02B 3/00* | (2006.01) |
| *H01L 51/50* | (2006.01) |

(52) U.S. Cl.
CPC ........ *H01L 27/3206* (2013.01); *G02B 3/0075* (2013.01); *G02B 27/0172* (2013.01); *H01L 27/3246* (2013.01); *H01L 51/5044* (2013.01); *H01L 51/5218* (2013.01); *H01L 51/5265* (2013.01); *H01L 27/322* (2013.01); *H01L 2251/5315* (2013.01)

(58) Field of Classification Search
CPC .. H01L 27/3206; G02B 3/0075; G02B 3/0172
USPC .......................................................... 359/741
See application file for complete search history.

(56) References Cited

U.S. PATENT DOCUMENTS

| | | | |
|---|---|---|---|
| 2021/0097943 A1* | 4/2021 | Wyatt | .................. G02F 1/1335 |
| 2021/0233975 A1* | 7/2021 | Bouthinon | ............ H01L 27/322 |

FOREIGN PATENT DOCUMENTS

WO    WO-2021035957 A1 *   3/2021

\* cited by examiner

*Primary Examiner* — Christopher M Raabe
(74) *Attorney, Agent, or Firm* — Morgan, Lewis & Bockius LLP

(57) ABSTRACT

An electroluminescent display device includes: a substrate including: a first subpixel, a second subpixel, and a third subpixel, a first electrode in each of the first to third subpixels, an emission layer on the first electrode and including: a first stack emitting first-colored light, and a second stack emitting second-colored light, the second stack being on the first stack, a second electrode on the emission layer, and a light-absorbing layer on the second electrode, wherein the first subpixel emits: light with a red wavelength range, and light with a cyan wavelength range, wherein the second subpixel emits light with a green wavelength range, wherein the third subpixel emits light with a blue wavelength range, and wherein the light-absorbing layer includes a cyan-absorbing material absorbing the light with the cyan wavelength range.

20 Claims, 10 Drawing Sheets

ELECTROLUMINESCENT DISPLAY DEVICE

CROSS-REFERENCE TO RELATED APPLICATION(S)

This application claims the benefit of and priority to Korean Patent Application No. 10-2018-0088043, filed on Jul. 27, 2018, the entirety of which is hereby incorporated by reference.

BACKGROUND

1. Technical Field

The present disclosure relates to an electroluminescent display device, and more particularly, to an electroluminescent display device configured to emit white light.

2. Discussion of the Related Art

In an electroluminescent display device, an emission layer is provided between an anode electrode and a cathode electrode. The emission layer emits light by an electric field generated between the above two electrodes, to thereby display an image.

The emission layer may include an organic material that emits light when an exciton is produced by a bond of an electron and a hole, and the exciton falls to a ground state from an excited state. Alternatively, the emission layer may include an inorganic material, such as quantum dot.

The emission layer may emit different-colored light for each subpixel, for example, red light, green light, blue light, or white light for each subpixel, or may emit the same-colored light for each subpixel, for example, white light for each subpixel. If the emission layer emits different-colored light for each subpixel, a different-colored emission layer has to be deposited for each subpixel through the use of a predetermined mask. This has limitations because of the increase in the number of mask processes. Also, if a mask is not aligned precisely, it is difficult to accurately deposit the emission layer for each subpixel. In contrast, if the emission layer emits same-colored light for each subpixel, for example, white light for each subpixel, there is no need for a mask to pattern the emission layer, and any problem caused by a mask process is not generated.

Recently, a head-mounted display (HMD) device has been developed to show a virtual reality (VR) in which a focus is formed within a short distance in front of user's eyes. In the case of the head-mounted display (HMD) device, realistically, it is difficult to manufacture a mask due to compact intervals of pixels by a high resolution, and also to precisely align the mask. Thus, in the case of the electroluminescent display device applied to the head-mounted display (HMD) device, a method of forming the emission layer that emits the white light for each subpixel may be easily applied because it has no requirement for the accurate mask manufacturing process and the precise mask alignment process.

In the method of forming the emission layer configured to emit the white light, a color filter has to be patterned for each subpixel so that each individual subpixel emits predetermined-colored light. For example, a red color filter has to be patterned in a red subpixel, a green color filter has to be patterned in a green subpixel, and a blue color filter has to be patterned in a blue subpixel.

However, if the predetermined color filter is individually patterned for each subpixel, a process of patterning the color filter may have a bad influence on an encapsulation layer positioned below the color filter. Also, in the case of the head mounted display (HMD) device, the subpixels are arranged at compact intervals, and an interval between the color filters becomes compact. Thus, a contact area of the color filter becomes so small that the color filter may be peeled off (e.g., separated).

SUMMARY

Accordingly, the present disclosure is directed to an electroluminescent display device that substantially obviates one or more of the issues due to limitations and disadvantages of the related art.

An aspect of the present disclosure is to provide an electroluminescent display device that does not need a process of patterning a color filter for each subpixel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: a substrate including: a first subpixel, a second subpixel, and a third subpixel, a first electrode in each of the first to third subpixels on the substrate, an emission layer on the first electrode and including: a first stack configured to emit first-colored light, and a second stack configured to emit second-colored light, the second stack being on the first stack, a second electrode on the emission layer, and a light-absorbing layer on the second electrode, wherein the first subpixel is configured to emit: light with a red wavelength range, and light with a cyan wavelength range, wherein the second subpixel is configured to emit light with a green wavelength range, wherein the third subpixel is configured to emit light with a blue wavelength range, and wherein the light-absorbing layer includes a cyan-absorbing material configured to absorb the light with the cyan wavelength range.

In another aspect, there is provided an electroluminescent display device, including: a substrate including: a first subpixel, a second subpixel, and a third subpixel, a first electrode in each of the first to third subpixels on the substrate, the first electrode including a reflective electrode, an emission layer on the first electrode, the emission layer being configured to emit white light, a second electrode on the emission layer, the second electrode including a semi-transparent electrode, and a light-absorbing layer on the second electrode and formed as one contiguous body across all of: the first subpixel, the second subpixel, the third subpixel, and the boundary area between each of the first to third subpixels, wherein the first subpixel is configured to emit light with a peak wavelength of a first wavelength range and light with a peak wavelength of a second wavelength range, wherein the second subpixel is configured to emit light with a peak wavelength of a third wavelength range, wherein the third subpixel is configured to emit light with a peak wavelength of a fourth wavelength range, and wherein the light-absorbing layer includes a material in which a light-absorbing ratio of the first wavelength range is higher than a respective light-absorbing ratio of each of the second wavelength range, the third wavelength range, and the fourth wavelength range.

In another aspect, there is provided an electroluminescent display device, including: a substrate including: a first subpixel, a second subpixel, and a third subpixel, a first electrode in each of the first to third subpixels on the substrate, the first electrode including a reflective electrode, an emission layer on the first electrode, the emission layer being configured to emit white light, a second electrode on the emission layer, the second electrode including a semi-transparent electrode, and a light-absorbing layer on the second electrode and formed as one contiguous body across all of: the first subpixel, the second subpixel, the third subpixel, and a boundary area between each of the first to third subpixels, wherein the first subpixel is configured to emit light with a peak wavelength of a first wavelength range and light with a peak wavelength of a second wavelength range, wherein the second subpixel is configured to emit light with a peak wavelength of a third wavelength range, wherein the third subpixel is configured to emit light with a peak wavelength of a fourth wavelength range, and wherein the light-absorbing layer includes a material in which a light-absorbing ratio of the first wavelength range is higher than a respective light-absorbing ratio of each of the second wavelength range, the third wavelength range, and the fourth wavelength range.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, that may be included to provide a further understanding of the disclosure and are incorporated in and constitute a part of this specification, illustrate embodiments of the disclosure and together with the description serve to explain various principles of the disclosure.

Figure 1:
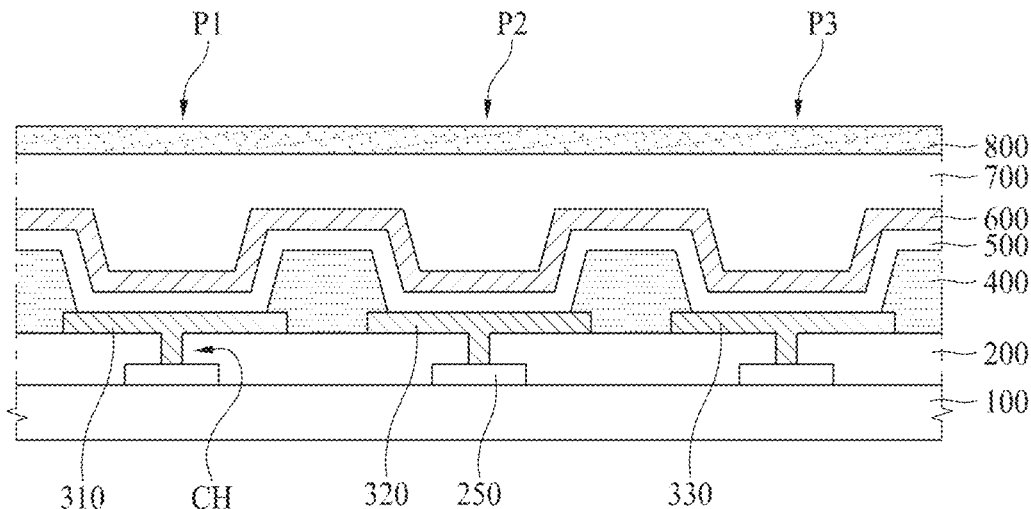
FIG. 1 is a cross-sectional view illustrating an electroluminescent display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an electroluminescent display device according to an embodiment of the present disclosure will be described in detail with reference to the accompanying drawings.

FIG. 1 is a cross-sectional view illustrating an electroluminescent display device according to an embodiment of the present disclosure.

As shown in FIG. 1, the electroluminescent display device according to an embodiment of the present disclosure may include a substrate 100, a circuit device layer 200, a first electrode 310, 320, and 330, a bank 400, an emission layer 500, a second electrode 600, an encapsulation layer 700, and a light-absorbing layer 800.

The substrate 100 may include glass or plastic, but embodiments are not limited to these materials. The substrate 100 may include a semiconductor material such as silicon wafer. The substrate 100 may include a transparent material or an opaque material. On the substrate 100, there may be a first subpixel (P1), a second subpixel (P2), and a third subpixel (P3). The first subpixel (P1) emits red (R)-colored light, the second subpixel (P2) emits green (G)-colored light, and the third subpixel (P3) emits blue (B)-colored light, but embodiments are not limited to this structure. For example, an arrangement order of the respective subpixels (P1, P2, P3) may be changed in various ways.

The electroluminescent display device according to an embodiment of the present disclosure may be formed in a top emission type where emitted light advances upwardly, but embodiments are not limited to this type. If the electroluminescent display device may be formed in the top emission type, the first substrate 100 may include an opaque material as well as a transparent material.

The circuit device layer 200 may be provided on the substrate 100.

In the circuit device layer 200, a circuit device comprising various signal lines, thin film transistors, and a capacitor may be provided for each subpixel (P1, P2, P3). The signal lines may include a gate line, a data line, a power line and a reference line, and the thin film transistors may include a switching thin film transistor, a driving thin film transistor and a sensing thin film transistor.

The switching thin film transistor may be switched by a gate signal supplied to the gate line, and the switching thin film transistor supplies a data voltage, which may be supplied from the data line, to the driving thin film transistor 250.

The driving thin film transistor 250 may be switched by the data voltage supplied from the switching thin film transistor, and the driving thin film transistor 250 generates a data current from power source supplied from the power line, and supplies the data current to the first electrode 310, 320, and 330.

The sensing thin film transistor senses a deviation of threshold voltage in the driving thin film transistor 250, which causes a deterioration of picture quality. The sensing thin film transistor supplies a current of the driving thin film transistor 250 to the reference line in response to a sensing control signal supplied from the gate line or an additional sensing line.

The capacitor maintains the data voltage supplied to the driving thin film transistor 250 for one frame period, and the capacitor may be connected to each of gate and source terminals of the driving thin film transistor 250.

In the circuit device layer 200, a contact hole (CH) may be provided for each subpixel (P1, P2, P3), and the source terminal or drain terminal of the driving thin film transistor 250 may be exposed via the contact hole (CH). As shown in the drawings, the contact hole (CH) may be provided in an emission area which may not be overlapped with the bank 400, but embodiments are not limited to this structure. The contact hole (CH) may be provided in a non-emission area which may be overlapped with the bank 400.

The first electrode 310, 320, and 330 may be provided on the circuit device layer 200, and may be patterned for each subpixel (P1, P2, P3). One first electrode 310 may be formed in the first subpixel (P1), another first electrode 320 may be formed in the second subpixel (P2), and another first electrode 330 may be formed in the third subpixel (P3).

The first electrode 310, 320, and 330 may be connected to the driving thin film transistor 250 provided in the circuit device layer 200. For example, the first electrode 310, 320, and 330 may be connected to the source terminal or drain terminal of the driving thin film transistor 250 via the contact hole (CH) provided in the circuit device layer 200.

The bank 400 may be configured to cover the end of the first electrode 310, 320, and 330 on the circuit device layer 200. Accordingly, it may be possible to prevent a current from being concentrated into the end of the first electrode 310, 320, and 330, to reduce or prevent deterioration of emission efficiency.

The bank 400 may be formed as a matrix configuration in the boundary between each of the plurality of subpixels (P1, P2, P3), and may be configured to define the emission area in each individual subpixel (P1, P2, P3). For example, an exposed area of the first electrode 310, 320, and 330, which may be exposed without being covered by the bank 400 in each subpixel (P1, P2, P3), becomes the emission area. The bank 400 may include an inorganic insulating film with a relatively small thickness, but not necessarily. However, the bank 400 may include an organic insulating film with a relatively large thickness.

The emission layer 500 may be on the first electrode 310, 320, and 330. The emission layer 500 may be on the bank 400. For example, the emission layer 500 may be in each of the subpixels (P1, P2, P3), and may also be in the boundary between the subpixels (P1, P2, P3).

The emission layer 500 may be configured to emit white (W) light. For example, the emission layer 500 may comprise a plurality of stacks configured to emit different colored light.

The second electrode 600 may be on the emission layer 500. The second electrode 600 may function as a cathode of the electroluminescent display device. In a similar manner as the emission layer 500, the second electrode 600 may be in each of the subpixels (P1, P2, P3), and may also be in the boundary between the subpixels (P1, P2, P3). For example, the second electrode 600 may be above the bank 400.

The electroluminescent display device according to an embodiment of the present disclosure may be formed as the top-emission type, and the second electrode 600 may include a conductive material capable of upwardly transmitting light emitted from the emission layer 500. Also, the second electrode 600 may include a semi-transparent electrode so that it may be possible to obtain a micro-cavity effect for each subpixel (P1, P2, P3). If the second electrode 600 includes the semi-transparent electrode, the micro-cavity effect may be obtained by repetitive reflection and re-reflection of the light between the second electrode 600 and the first electrode 310, 320, and 330 to improve light efficiency.

The encapsulation layer 700 may be formed on the second electrode 600 to reduce or prevent external moisture from permeating into the emission layer 500. The encapsulation layer 700 may be formed as a single-layered structure of an inorganic insulating material, or as a deposition structure obtained by alternately depositing an inorganic insulating material and an organic insulating material, but embodiments are not limited to these structures.

The light-absorbing layer 800 may be on the encapsulation layer 700. The light-absorbing layer 800 may absorb light with a predetermined wavelength range from the light emitted from the emission layer 500, and each individual subpixel (P1, P2, P3) may emit only light with a predetermined wavelength range. The light-absorbing layer 800 may include materials capable of absorbing light with a predetermined wavelength range, which may be generally known to those in the art, for example, dye, resin, and/or a dielectric capable of absorbing light with a predetermined wavelength range.

The light-absorbing layer 800 may not be patterned for each subpixel (P1, P2, P3), but may be formed as one contiguous body in the respective subpixels (P1, P2, P3) and the boundary between each of the subpixels (P1, P2, P3). For example, the light-absorbing layer 800 may be formed as one contiguous body above the first electrode 310, 320, and 330 and the bank 400.

The light-absorbing layer 800 may be disposed at various positions on the second electrode 600. For example, the light-absorbing layer 800 may be between the second electrode 600 and the encapsulation layer 700. Also, a capping layer may be additionally provided between the second electrode 600 and the encapsulation layer 700. For example, the light-absorbing layer 800 may be between the capping layer and the encapsulation layer 700.

According to an embodiment of the present disclosure, a distance between the first electrode 310 and the second electrode 600 may be different in the respective subpixels (P1, P2, P3) so that different colored light may be emitted from each individual subpixel (P1, P2, P3) through the micro-cavity property.

If the first electrode 310 includes a reflective electrode, and the second electrode 600 may include a semi-transparent electrode, light reflection and re-reflection between the reflective electrode and the semi-transparent electrode may be repeated. For example, when a distance between the reflective electrode and the semi-transparent electrode becomes an integer multiple of half-wavelength ($\lambda/2$) of the light with a predetermined wavelength, a constructive interference may occur, to thereby improve an external extraction efficiency of the light. This light property may be referred to as the "micro-cavity" property.

Due to the micro-cavity property, for example, if a distance the reflective electrode and the semi-transparent electrode in the first subpixel (P1) becomes an integer multiple of half-wavelength ($\lambda/2$) of light with a red wavelength, a constructive interference may occur in the light with the red wavelength, a destructive interference may occur in light with other wavelengths, and an intensity of the light with the red wavelength may be relatively greater than that of the light with other wavelengths in the first subpixel (P1). Accordingly, it may enable an effect of emitting the light with the red wavelength from the first subpixel (P1) without using an additional color filter.

Also, if a distance the reflective electrode and the semi-transparent electrode in the second subpixel (P2) becomes an integer multiple of half-wavelength ($\lambda/2$) of light with a green wavelength, a constructive interference may occur in the light with the green wavelength, a destructive interference may occur in light with other wavelengths, and an intensity of the light with the green wavelength may be relatively greater than that of the light with other wavelengths in the second subpixel (P2). Accordingly, it may enable an effect of emitting the light with the green wavelength from the second subpixel (P2) without using an additional color filter.

Also, if a distance the reflective electrode and the semi-transparent electrode in the third subpixel (P3) becomes an integer multiple of half-wavelength ($\lambda/2$) of light with a blue wavelength, a constructive interference may occur in the light with the blue wavelength, a destructive interference may occur in light with other wavelengths, and an intensity of the light with the blue wavelength may be relatively greater than that of the light with other wavelengths in the third subpixel (P3). Accordingly, it may have an effect of emitting the light with the blue wavelength from the third subpixel (P3) without using an additional color filter.

Thus, according to an embodiment of the present disclosure, even though an additional color filter may not be patterned for each subpixel (P1, P2, P3), the red light may be emitted from the first subpixel (P1), the green light may be emitted from the second subpixel (P2), and the blue light may be emitted from the third subpixel (P3). However, even if using the micro-cavity property, each individual subpixel may emit, not only light with a desired wavelength range, but also light with an undesired wavelength. For example, the first subpixel (P1) may emit, not only the red light, but also other colors of light, for example, cyan light, partially.

Thus, according to an embodiment of the present disclosure, the light-absorbing layer 800 may be formed on the second electrode 600 so that it may be possible to reduce or prevent the light with the undesired wavelength range from being emitted from each subpixel through the use of light-absorbing layer 800. For example, it may be possible to reduce or prevent the cyan light from being emitted from the first subpixel (P1) through the use of light-absorbing layer 800 capable of absorbing the cyan light.

Hereinafter, a structure configured to emit light with a predetermined wavelength range by each individual subpixel (P1, P2, P3) through the use of micro-cavity property will be described in detail as follows.

Figure 2:
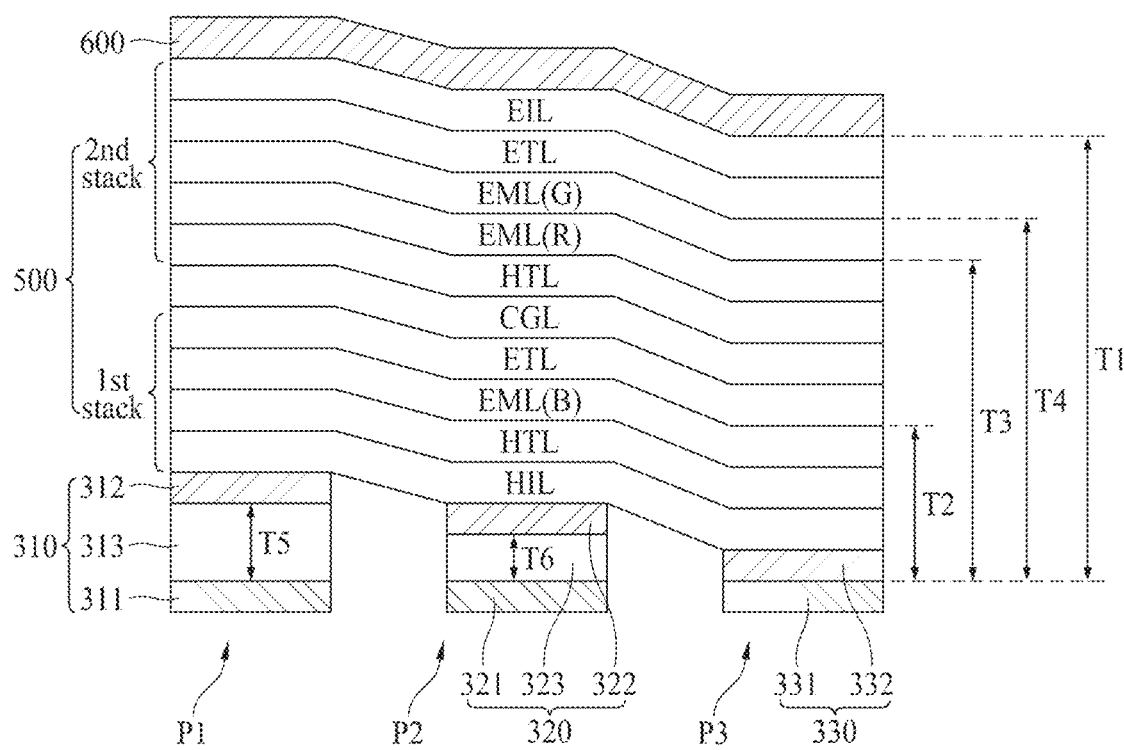
FIG. 2 is a cross-sectional view illustrating a detailed structure of a first electrode and an emission layer in the electroluminescent display device according to an embodiment of the present disclosure.

FIG. 2 is a cross-sectional view illustrating a detailed structure of a first electrode and an emission layer in the electroluminescent display device according to an embodiment of the present disclosure.

FIG. 2 illustrates a detailed structure of the first electrode 310, 320, and 330 and the emission layer 500 in the structure of FIG. 1. In FIG. 2, for convenience of explanation, the substrate 100, the circuit device layer 200, the bank 400, the encapsulation layer 700, and the light-absorbing layer 800 are not illustrated again.

As shown in FIG. 2, the first electrode 310, 320, and 330 may be patterned for each subpixel (P1, P2, P3), the emission layer 500 may be on the first electrode 310, 320, and 330, and the second electrode 600 may be on the emission layer 500. The first electrode 310 provided in the first subpixel (P1) may include a first lower electrode 311, a first upper electrode 312, and a first dielectric layer 313 between the first lower electrode 311 and the first upper electrode 312.

The first upper electrode 312 may be electrically connected to the source terminal or drain terminal of the aforementioned driving thin film transistor 250. For example, the first upper electrode 312 may be directly connected to the source terminal or drain terminal of the driving thin film transistor 250, or may be connected to the source terminal or drain terminal of the driving thin film transistor 250 via the first lower electrode 311. Thus, the first upper electrode 312 may be connected to the first lower electrode 311 via a contact hole (not shown) in the first dielectric layer 313, but embodiments are not limited to this structure. The first upper electrode 312 may not be connected to the first lower electrode 311. The first lower electrode 311 may function as a reflective electrode, but may not function as an anode for generating a hole. Thus, the connection between the first lower electrode 311 and the first upper electrode 312 may be optional.

The first lower electrode 311 may include a reflective electrode for upwardly reflecting the light emitted from the emission layer 500, and the first upper electrode 312 may include a transparent electrode for generating a hole. Accordingly, a micro-cavity effect may be obtained by repetitive light reflection and re-reflection between the first lower electrode 311 of the reflective electrode and the second electrode 600 of the semi-transparent electrode.

In embodiments of the present disclosure, the reflective electrode may be the electrode configured to reflect the incident light, the transparent electrode may be the electrode configured to transmit the incident light, and the semi-transparent electrode may be the electrode configured to reflect some of the incident light and to transmit the remaining light. In the aspect of transparency, the transparent electrode, the semi-transparent electrode and the reflective electrode may be sequentially ranked in order of excellence of transparency. In the aspect of reflectance, the reflective electrode, the semi-transparent electrode and the transparent electrode may be sequentially ranked in order of excellence of reflectance.

When a distance (T1+T5) between the first lower electrode 311 and the second electrode 600 becomes an integer multiple of half-wavelength ($\lambda/2$) of the light with the red wavelength, a constructive interference may occur, and the light with the red wavelength may be further amplified. Also, an amplified level of the light with the red wavelength may be continuously increased by the aforementioned repetitive reflection and re-reflection process.

For example, the first dielectric layer 313 between the first lower electrode 311 and the first upper electrode 312 may cause the distance between the first lower electrode 311 and the second electrode 600 to be the integer multiple of half-wavelength ($\lambda/2$) of the light with the red wavelength. For example, a fifth thickness (T5) of the first dielectric layer 313 may be adjusted appropriately. The first dielectric layer 313 may include a transparent material, for example, silicon oxide, silicon nitride, indium tin oxide (ITO), and/or indium zinc oxide (IZO).

A first distance (T1) from a lower surface of the first upper electrode 312 to a lower surface of the second electrode 600 in the first subpixel (P1) may be identical to a first distance (T1) from a lower surface of the third upper electrode 332 to a lower surface of the second electrode 600 in the third subpixel (P3). To obtain the micro-cavity effect in the third subpixel (P3), the first distance (T1) from the lower surface of the third upper electrode 332 to the lower surface of the second electrode 600 in the third subpixel (P3) may be within a range of 1800 Å to 2300 Å, for example. Accordingly, the first distance (T1) from the lower surface of the first upper electrode 312 to the lower surface of the second electrode 600 in the first subpixel (P1) may be within a range of 1800 Å to 2300 Å, for example.

When the first distance (T1) from the lower surface of the first upper electrode 312 to the lower surface of the second electrode 600 in the first subpixel (P1) is within a range of 1800 Å to 2300 Å, a thickness (T5) of the first dielectric layer 313 may be within a range of 2300 Å to 4100 Å in consideration of the realization of the micro-cavity effect. For example, if the first dielectric layer 313 of silicon oxide has a refractive index within a range of 1.4 to 1.7, a thickness (T5) of the first dielectric layer 313 may be within a range of 3200 Å to 4100 Å, for example. If the first dielectric layer 313 of IZO has a refractive index within a range of 1.8 to 2.1, a thickness (T5) of the first dielectric layer 313 may be within a range of 2300 Å to 3200 Å, for example.

The first electrode 320 in the second subpixel (P2) may include a second lower electrode 321, a second upper electrode 322, and a second dielectric layer 323 between the second lower electrode 321 and the second upper electrode 322. The second upper electrode 322 may be electrically connected to the source terminal or drain terminal of the aforementioned driving thin film transistor 250. For example, the second upper electrode 322 may be directly connected to the source terminal or drain terminal of the driving thin film transistor 250, or may be connected to the source terminal or drain terminal of the driving thin film transistor 250 via the second lower electrode 321. Thus, the second upper electrode 322 may be connected to the second lower electrode 321 via a contact hole (not shown) provided in the second dielectric layer 323, but embodiments are not limited to this structure. The second upper electrode 322 may not be connected to the second lower electrode 321. The second lower electrode 321 may function as a reflective electrode, but may not function as an anode for generating a hole. Thus, the connection between the second lower electrode 321 and the second upper electrode 322 may be optional.

The second lower electrode 321 may include a reflective electrode for upwardly reflecting the light emitted from the emission layer 500, and the second upper electrode 322 may include a transparent electrode for generating a hole. Accordingly, a micro-cavity effect may be obtained by repetitive light reflection and re-reflection between the second lower electrode 321 of the reflective electrode and the second electrode 600 of the semi-transparent electrode. The second lower electrode 321 may include the same material as that of the first lower electrode 311. The second upper electrode 322 may include the same material as that of the first upper electrode 312.

When a distance (T1+T6) between the second lower electrode 321 and the second electrode 600 becomes an integer multiple of half-wavelength ($\lambda/2$) of the light with the green wavelength, a constructive interference may occur, and the light with the green wavelength may be further amplified. Also, an amplified level of the light with the green wavelength may be continuously increased by the aforementioned repetitive reflection and re-reflection process.

For example, the second dielectric layer 323 between the second lower electrode 321 and the first upper electrode 312 may cause the distance (T1+T6) between the second lower electrode 321 and the second electrode 600 to be the integer multiple of half-wavelength ($\lambda/2$) of the light with the green wavelength. For example, a thickness (T6) of the second dielectric layer 323 may be adjusted appropriately. The second dielectric layer 323 may include the same material as that of the first dielectric layer 313.

A first distance (T1) from a lower surface of the second upper electrode 322 to a lower surface of the second electrode 600 in the second subpixel (P2) may be identical to a first distance (T1) from a lower surface of the third upper electrode 332 to a lower surface of the second electrode 600 in the third subpixel (P3). Accordingly, the first distance (T1) from the lower surface of the second upper electrode 322 to the lower surface of the second electrode 600 in the second subpixel (P2) may be within a range of 1800 Å to 2300 Å, for example.

When the first distance (T1) from the lower surface of the second upper electrode 322 to the lower surface of the second electrode 600 is within a range of 1800 Å to 2300 Å, a thickness (T6) of the second dielectric layer 323 may be within a range of 400 Å to 700 Å in consideration of the realization of the micro-cavity effect, for example. For example, if the second dielectric layer 323 of silicon oxide has a refractive index within a range of 1.4 to 1.7, a thickness (T6) of the second dielectric layer 323 may be within a range of 500 Å to 700 Å, for example. If the second dielectric layer 323 of IZO has a refractive index within a range of 1.8 to 2.1, a thickness (T6) of the second dielectric layer 323 may be within a range of 400 Å to 550 Å, for example.

The first electrode 330 in the third subpixel (P3) may include a third lower electrode 331 and a third upper electrode 332. The third upper electrode 332 may be electrically connected to the source terminal or drain terminal of the aforementioned driving thin film transistor 250. For example, the third upper electrode 332 may be directly connected to the source terminal or drain terminal of the driving thin film transistor 250, or may be connected to the source terminal or drain terminal of the driving thin film transistor 250 via the third lower electrode 331. The third upper electrode 332 may be on an upper surface of the third lower electrode 331. If desired, a third dielectric layer may be additionally provided between the third upper electrode 332 and the third lower electrode 331.

The third lower electrode 331 may include a reflective electrode for upwardly reflecting the light emitted from the emission layer 500. The third upper electrode 332 may include a transparent electrode for generating a hole. Accordingly, a micro-cavity effect may be obtained by repetitive light reflection and re-reflection between the third lower electrode 331 of the reflective electrode and the second electrode 600 of the semi-transparent electrode. The third lower electrode 331 may include the same material as that of the first lower electrode 311 or second lower electrode 321. The third upper electrode 332 may include the same material as that of the first upper electrode 312 or second upper electrode 322.

When a distance (T1) between the third lower electrode 331 and the second electrode 600 becomes an integer multiple of half-wavelength ($\lambda/2$) of the light with the blue wavelength, a constructive interference may occur, and the light with the blue wavelength may be further amplified. Also, an amplified level of the light with the blue wavelength may be continuously increased by the aforementioned repetitive reflection and re-reflection process.

In consideration of the realization of the micro-cavity effect, the first distance (T1) from the lower surface of the third upper electrode 332 to the lower surface of the second electrode 600 may be within a range of 1800 Å to 2300 Å, for example. According to an embodiment of the present disclosure, the first distance (T1) between the third lower electrode 331 and the second electrode 600 may be the integer multiple of half-wavelength ($\lambda/2$) of the light with the blue wavelength without using the third dielectric layer between the third upper electrode 332 and the third lower electrode 331. If desired, the third dielectric layer may be provided between the third upper electrode 332 and the third lower electrode 331 so that the first distance (T1) between the third lower electrode 331 and the second electrode 600 may become the integer multiple of half-wavelength ($\lambda/2$) of the light with the blue wavelength. For example, the third dielectric layer may include the same material as that of the second dielectric layer 323 or first dielectric layer 313.

The emission layer 500 may be formed in a substantially similar structure for each subpixel (P1, P2, P3). The emission layer 500 may include a first stack ($1^{st}$ stack) configured to emit first-colored light, a second stack ($2^{nd}$ stack) configured to emit second-colored light, and a charge generating layer (CGL) between the first stack and the second stack.

The first stack ($1^{st}$ stack) may be on the first electrode 310, 320, and 330. The first stack ($1^{st}$ stack) may be formed as a deposition structure obtained by sequentially depositing a hole injecting layer (HIL), a hole transporting layer (HTL), a blue emitting layer (EML(B)), and an electron transporting layer (ETL), but embodiments are not limited to this structure. A second distance (T2) from a lower surface of the upper electrode 312, 322, and 332 included in the first electrode 310, 320, and 330 to an upper surface of the blue emitting layer (EML(B)) may be within a range of 420 Å to 520 Å to increase an intensity of the blue light in the third subpixel (P3), for example.

The second stack ($2^{nd}$ stack) may be on the charge generating layer (CGL). The second stack ($2^{nd}$ stack) may be formed as a deposition structure obtained by sequentially depositing a hole transporting layer (HTL), a red emitting layer (EML(R)), a green (G) emitting layer (EML(G)), an electron transporting layer (ETL), and an electron injecting layer (EIL), but embodiments are not limited to this structure. A third distance (T3) from a lower surface of the upper electrode 312, 322, and 332 included in the first electrode 310, 320, and 330 to an upper surface of the red emitting layer (EML(R)) may be within a range of 1200 Å to 1500 Å to increase an intensity of the red light in the first subpixel (P1), for example.

A fourth distance (T4) from a lower surface of the upper electrode 312, 322, and 332 included in the first electrode 310, 320, and 330 to an upper surface of the green emitting layer (EML(G)) may be within a range of 1400 Å to 1750

Å to increase an intensity of the green light in the second subpixel (P2), for example. The charge generating layer (CGL) may be formed as a deposition structure obtained by depositing an N-type charge generating layer configured to supply an electron to the first stack ($1^{st}$ stack), and a P-type charge generating layer configured to supply a hole to the second stack ($2^{nd}$ stack).

Figure 3:
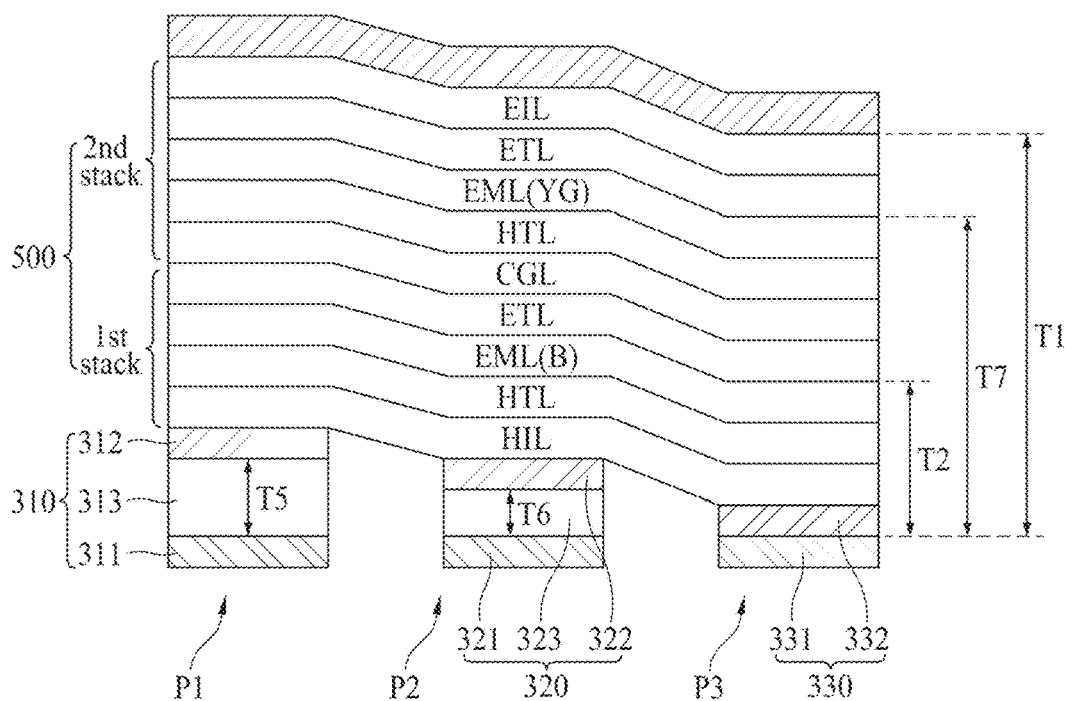
FIG. 3 is a cross-sectional view illustrating a detailed structure of a first electrode and an emission layer in an electroluminescent display device according to an embodiment of the present disclosure.

FIG. 3 is a cross-sectional view illustrating a detailed structure of a first electrode and an emission layer in an electroluminescent display device according to an embodiment of the present disclosure.

Except for a structure of a second stack ($2^{nd}$ stack), the electroluminescent display device of the FIG. 3 example is substantially similar to the electroluminescent display device of the FIG. 2 example. Accordingly, the same reference numbers will be used throughout the drawings to refer to the same or like parts, and only the different structures will be described.

As shown in FIG. 3, according to an embodiment of the present disclosure, a second stack ($2^{nd}$ stack) on a charge generating layer (CGL) may be formed as a deposition structure obtained by sequentially depositing a hole transporting layer (HTL), a yellow-green (YG) emitting layer (EML(YG)), an electron transporting layer (ETL), and an electron injecting layer (EIL). For example, a seventh distance (T7) from a lower surface of an upper electrode 312, 322, and 332 included in a first electrode 310, 320, and 330 to an upper surface of the yellow-green (YG) emitting layer (EML(YG)) may be within a range of 1350 Å to 1650 Å to increase an intensity of the red light and the green light in the first subpixel (P1) and the second subpixel (P2), for example.

In addition, a first distance (T1), a second distance (T2), a fifth distance (T5), and a sixth distance (T6) in the electroluminescent display device of FIG. 3 may be the same as those in the electroluminescent display device of FIG. 2. Hereinafter, a peak wavelength range for each subpixel will be described as follows.

Figure 4:
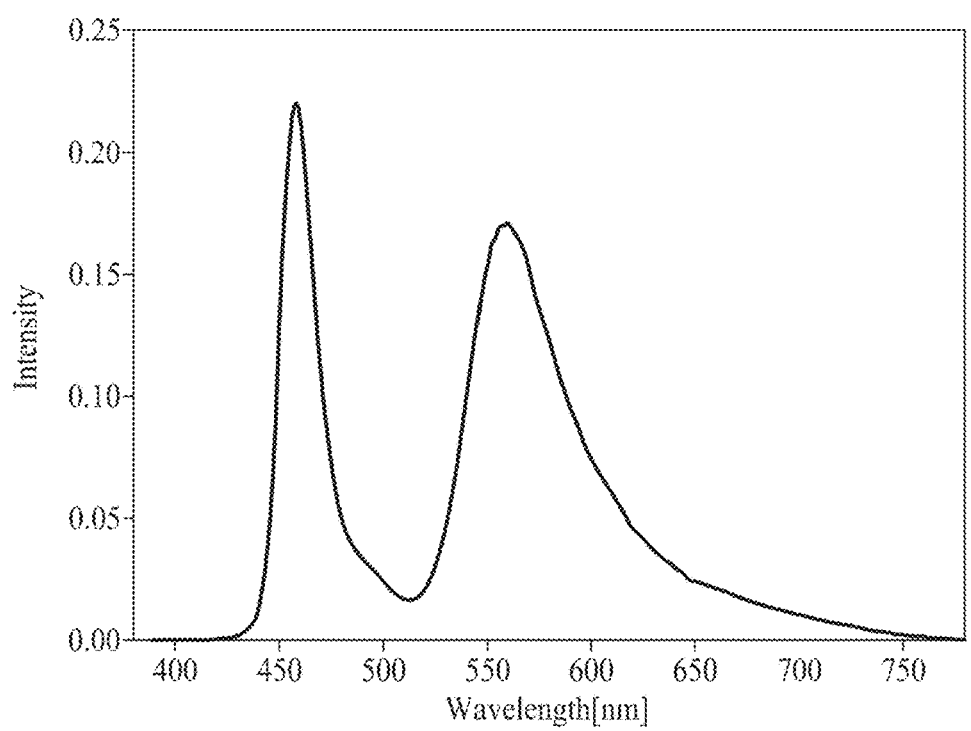
FIG. 4 is a graph illustrating a light intensity by each wavelength range in a related art electroluminescent display device configured to emit white light.

FIG. 4 is a graph illustrating a light intensity by each wavelength range in a related art electroluminescent display device configured to emit white light.

For example, FIG. 4 relates to an electroluminescent display device configured to emit white light for each subpixel without consideration of micro-cavity property for each subpixel. As shown in FIG. 4, in the related art electroluminescent display device, one peak wavelength may be generated at about 460 nm corresponding to a short wavelength range in all subpixels, and another peak wavelength may be generated at about 560 nm corresponding to a long wavelength range in all subpixels.

Accordingly, in the related art, a blue subpixel emitting a short wavelength requires a blue color filter to block light with a middle wavelength range and light with a long wavelength range, a green subpixel emitting a middle wavelength requires a green color filter to block light with a short wavelength range and light with a long wavelength range, and a red subpixel emitting a long wavelength requires a red color filter to block light with a short wavelength range and light with a middle wavelength range. Accordingly, in the case of the related art, a color filter has to be patterned for each subpixel.

Figure 5:
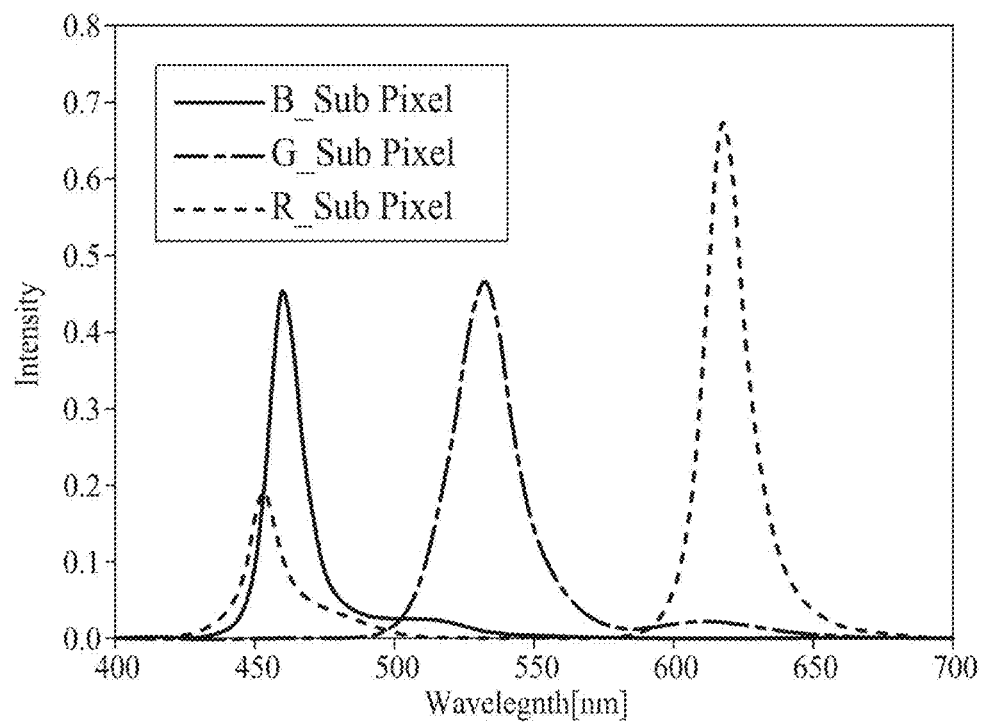
FIG. 5 is a graph illustrating a light intensity by each wavelength range in an electroluminescent display device according to a comparative example configured to emit white light and to realize a micro-cavity property.

FIG. 5 is a graph illustrating a light intensity by each wavelength range in an electroluminescent display device according to a comparative example configured to emit white light and to realize a micro-cavity property.

In FIG. 5, an emission layer is positioned at a first antinode in all of first to third subpixels to generate a constructive interference. The antinode corresponds to a point at which an amplitude of a light wave has the largest value, and a light intensity at the antinode is the largest. As shown in FIG. 5, in the case of a first subpixel (P1) for a red (R) color, one peak wavelength may be generated at about 620 nm corresponding to a red color, and another peak wavelength may be generated at about 450 nm corresponding to a blue color. One peak wavelength may be generated at about 530 nm corresponding to a green color in a second subpixel (P2) for a green (G) color, and one wavelength may be generated at about 460 nm corresponding to a blue color in a third subpixel (P3) for a blue (B) color.

Accordingly, in FIG. 5, in the case of the second subpixel (P2) for the green (G) color, light with other wavelengths, other than the green color, may be decreased in its light intensity by the destructive interference, and light with a wavelength of the green color may be increased in its light intensity by the constructive interference. In the case of the third subpixel (P3) for the blue (B) color, light with other wavelengths, other than the blue color, may be decreased in its light intensity by the destructive interference, and light with a wavelength of the blue color may be increased in its light intensity by the constructive interference. In the case of the first subpixel (P1) for the red (R) color, light with a wavelength of the red color may be increased in its light intensity by the constructive interference, however, light with a wavelength of the blue color may not be decreased in its light intensity by the destructive interference, and may then be emitted.

Accordingly, in the case of FIG. 5, the light with the wavelength range of the blue color may be emitted from the first subpixel (P1) for the red (R) color, and it may be required to absorb the light with the wavelength range of the blue color in the first subpixel (P1) for the red (R) color. Accordingly, the aforementioned light-absorbing layer 800 needs to include a material for absorbing the light with the wavelength range of the blue color in the related art.

However, if the light-absorbing layer 800 absorbs the light with the wavelength range of the blue color, the light with the wavelength range of the blue color, which may be emitted from the third subpixel (P3), may be absorbed in the light-absorbing layer 800, and the light with the wavelength range of the blue color may not be emitted from the third subpixel (P3). Accordingly, in the case of FIG. 5, it may be impossible to provide the light-absorbing layer 800, which may be patterned as one contiguous body in the respective subpixels (P1, P2, P3) and the boundary between each of the respective subpixels. As a result, the light-absorbing layer 800 has to be separately patterned in each of the position corresponding to the first subpixel (P1), and the position corresponding to the second and third subpixels (P2, P3).

Figure 6:
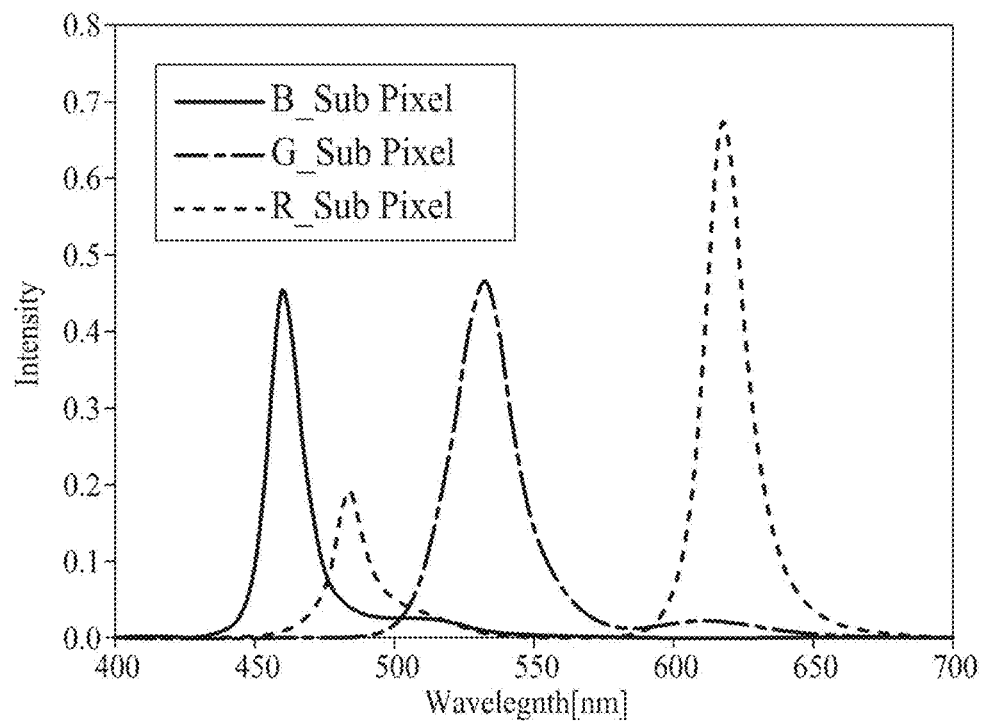
FIG. 6 is a graph illustrating a light intensity by each wavelength range in the electroluminescent display device according to an embodiment of the present disclosure configured to emit white light and to realize a micro-cavity property.

FIG. 6 is a graph illustrating a light intensity by each wavelength range in the electroluminescent display device according to an embodiment of the present disclosure configured to emit white light and to realize a micro-cavity property.

In the example of FIG. 6, the electroluminescent display device is provided such that an emission layer is positioned at a second antinode in a first subpixel, and an emission layer is positioned at a first antinode in second and third subpixels to generate a constructive interference. As shown in FIG. 6, in the case of a first subpixel (P1) for a red (R) color, one peak wavelength may be generated at about 620 nm corresponding to a red color, and another peak wavelength may be generated at about 480 nm corresponding to a cyan color. Meanwhile, one peak wavelength may be generated at about 530 nm corresponding to a green color in a second subpixel (P2) for a green (G) color, and one wavelength may be generated at about 460 nm corresponding to a blue color in a third subpixel (P3) for a blue (B) color.

Thus, in FIG. 6, in the case of the second subpixel (P2) for the green (G) color, light with other wavelengths, other than the green color, may be decreased in its light intensity by the destructive interference, and light with a wavelength of the green color may be increased in its light intensity by the constructive interference. In the case of the third subpixel (P3) for the blue (B) color, light with other wavelengths, other than the blue color, may be decreased in its light intensity by the destructive interference, and light with a wavelength of the blue color may be increased in its light intensity by the constructive interference. In the case of the first subpixel (P1) for the red (R) color, light with a wavelength of the red color may be increased in its light intensity by the constructive interference, however, light with a wavelength of the cyan color may not be decreased in its light intensity by the destructive interference, and may then be emitted.

Accordingly, in the case of FIG. 6, the light with the wavelength range of the cyan color may be emitted from the first subpixel (P1) for the red (R) color, and the light with the wavelength range of the cyan color in the first subpixel (P1) for the red (R) color may be absorbed. Accordingly, the aforementioned light-absorbing layer 800 may include a material for absorbing the light with the wavelength range of the cyan color.

Unlike in the aforementioned case of the FIG. 5 related art, the FIG. 6 example embodiment shows that the light with the wavelength range of the cyan color may be absorbed in the light-absorbing layer 800, and the light with the wavelength range of the blue color emitted from the third subpixel (P3) may not be absorbed in the light-absorbing layer 800. Thus, in the example of FIG. 6, even though the light-absorbing layer 800 may be formed as one contiguous body in the respective subpixels (P1, P2, P3) and the boundary between the respective subpixels, without being patterned for each subpixel (P1, P2, P3), it may have no problem related to the emission of the light with the wavelength range of the blue color in the third subpixel (P3). As a result, in the example of FIG. 6, it may be advantageous in that the light-absorbing layer 800 may be patterned as one contiguous body in the respective subpixels (P1, P2, P3) and the boundary between the respective subpixels, without being patterned for each subpixel (P1, P2, P3).

Thus, according to an embodiment of the present disclosure, as shown in FIG. 6, the peak wavelength range may be provided for each subpixel (P1, P2, P3), for example. For example, according to an embodiment of the present disclosure, in the case of the first subpixel (P1) for the red color, one peak wavelength may be generated at the red wavelength range of 610 nm to 630 nm, and another peak wavelength may be generated at the cyan wavelength range of 475 nm to 505 nm, for example. Also, a full width at half maximum (FWHM) in the red wavelength range may be within a range of 20 nm to 30 nm, for example.

Also, in the case of the second subpixel (P2) for the green color, one peak wavelength may be generated at the green wavelength range of 510 nm to 540 nm, and a full width at half maximum (FWHM) in the green wavelength range may be within a range of 30 nm to 40 nm, for example. Also, in the case of the third subpixel (P2) for the blue color, one peak wavelength may be generated at the blue wavelength range of 450 nm to 470 nm, and a full width at half maximum (FWHM) in the blue wavelength range may be within a range of 20 nm to 30 nm, for example.

Also, the light-absorbing layer 800 may include a material for absorbing the light with the wavelength range of the cyan color corresponding to 475 nm to 505 nm, for example. For example, the light-absorbing layer 800 has a light transmittance of 80% or more for the light with other wavelength ranges, and has a light transmittance of 10% or less for the light with the wavelength range of the cyan color, for example.

Hereinafter, the emission of the red light and the blue light from the first subpixel (P1) as shown in FIG. 5, and the emission of the red light and the cyan light from the first subpixel (P1) as shown in FIG. 6 in accordance with the degree of the antinode at which the emission layer may be positioned will be described as follows.

Figure 7:
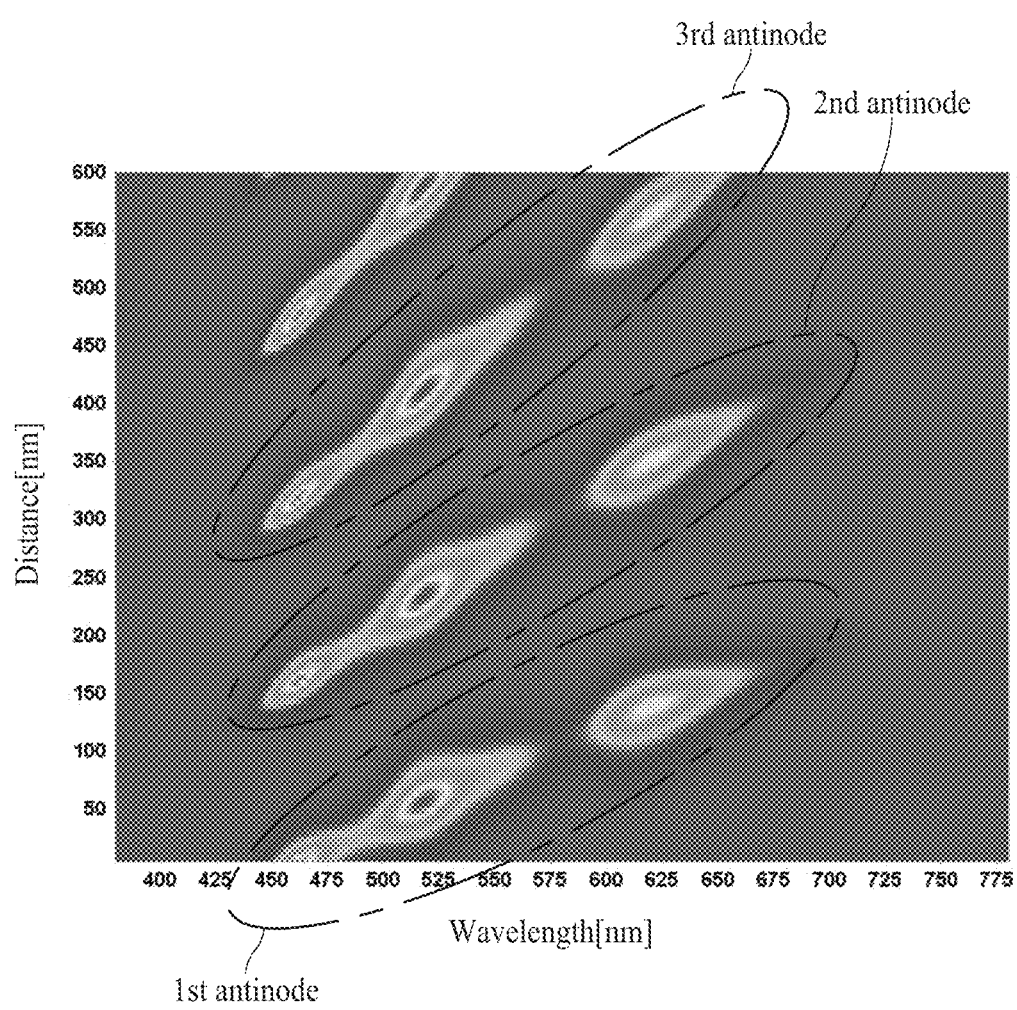
FIG. 7 illustrates a light intensity by each wavelength range in accordance with the change of distance between a lower electrode and an upper electrode in the electroluminescent display device according to an embodiment of the present disclosure.

FIG. 7 illustrates a light intensity by each wavelength range in accordance with the change of distance between a lower electrode and an upper electrode in the electroluminescent display device according to an embodiment of the present disclosure.

FIG. 7 illustrates a light intensity by each wavelength range in accordance with the change of distance between the lower electrode 311, 321, and 331 and the upper electrode 312, 322, and 332 in the structure of the FIG. 2 example. For example, in FIG. 7, a vertical axis (y-axis) indicates the distance between the lower electrode 311, 321, and 331 and the upper electrode 312, 322, and 332 in the aforementioned structure of FIG. 2, and a horizontal axis (x-axis) indicates the light wavelength. In the FIG. 7 example, silicon oxide having a refractive index of 1.4 to 1.7 may be used as a dielectric provided between the lower electrode 311, 321, and 331 and the upper electrode 312, 322, and 332.

As shown in FIG. 7, in the case of the blue wavelength range between 450 nm and 470 nm, the first antinode may be generated when the distance is '0', the second antinode may be generated when the distance is about 150 nm, and the third antinode may be generated when the distance is about 320 nm. Also, in the case of the green wavelength range between 510 nm and 540 nm, the first antinode may be generated when the distance is about 60 nm, the second antinode may be generated when the distance is about 230 nm, and the third antinode may be generated when the distance is about 400 nm. Also, in the case of the red wavelength range between 610 nm and 630 nm, the first antinode may be generated when the distance is about 150 nm, the second antinode may be generated when the distance is about 350 nm, and the third antinode may be generated when the distance is about 550 nm.

In the case of the third subpixel (P3) for emitting the blue light, the distance may be set to be '0' so that the light intensity of the blue wavelength in the first antinode may be at a maximum. If the distance is '0', the antinode may not be generated in the green wavelength range and the red wavelength range, and the destructive interference may be generated in the light with the green wavelength and the light with the red wavelength. Accordingly, in the above examples of FIGS. 2 and 3, in the case of the third subpixel, an additional dielectric layer may not be provided between the third lower electrode 331 and the third upper electrode 332.

In the case of the second subpixel (P2) for emitting the green light, the distance may be 60 nm, and more broadly, within a range of 50 nm to 70 nm so that the light intensity of the green wavelength in the first antinode may be at a maximum. If the distance is within a range of 50 nm to 70 nm, the antinode may not be generated in the blue wavelength range and the red wavelength range, and the destructive interference may be generated in the light with the blue wavelength and the light with the red wavelength. Accordingly, in the above examples of FIGS. 2 and 3, in the case of the second subpixel, the second dielectric layer 323 may be provided between the second lower electrode 321 and the second upper electrode 322 in the second subpixel, and the thickness (T6) of the second dielectric layer 323 having the refractive index of 1.4 to 1.7 may be within the range of 500 Å to 700 Å. Although not shown, on the presumption that the second dielectric layer 323 of IZO has the refractive index within the range of 1.8 to 2.1, if the distance is within a range of 40 nm to 55 nm, the first antinode may be generated in the green wavelength range. Thus, the thickness (T6) of the second dielectric layer 323 having the refractive index within the range of 1.8 to 2.1, such as IZO, may be within the range of 400 Å to 550 Å.

In the case of the first subpixel (P1) for emitting the red light, the distance may be 150 nm so that the light intensity of the red wavelength in the first antinode may be at a maximum. If the distance is 150 nm, the antinode may not be generated in the green wavelength range, the second antinode may be generated in the blue wavelength range, the destructive interference may be generated in the light with the green wavelength, and the destructive interference may not be generated in the light with the blue wavelength. Accordingly, the red light and the blue light may be emitted from the first subpixel (P1), and it shows the peak wavelength shown in the related art of FIG. 5.

In the case of the first subpixel (P1) for emitting the red light, the distance may be about 350 nm, and more broadly, within a range of 320 nm to 410 nm so that the light intensity of the red wavelength in the second antinode may be at a maximum. For example, the antinode may not be generated in the green wavelength range, and the antinode may be generated in the cyan wavelength range within the range of 475 nm to 505 nm. Thus, in the case of the first subpixel (P1) for emitting the red light, if the distance is 320 nm to 410 nm, the red light and the cyan light may be emitted from the first subpixel (P1), and it shows the peak wavelength of the example of FIG. 6. For example, in the above FIG. 2, in the case of the first subpixel (P1), the first dielectric layer 313 may be provided between the first lower electrode 311 and the first upper electrode 312, and the thickness (T5) of the first dielectric layer 313 having the refractive index of 1.4 to 1.7, such as silicon oxide, may be within the range of 3200 Å to 4100 Å. Although not shown, on the presumption that the first dielectric layer 313 of IZO has the refractive index within the range of 1.8 to 2.1, if the distance is within a range of 230 nm to 320 nm, the second antinode may be generated in the red wavelength range, and the antinode may be generated in the cyan wavelength range within the range of 475 nm to 505 nm. Thus, the thickness (T5) of the first dielectric layer 313 having the refractive index within the range of 1.8 to 2.1, such as IZO, may be within the range of 2300 Å to 3200 Å.

As a result, according to an embodiment of the present disclosure, in the case of the second subpixel (P2) for emitting the green light and the third subpixel (P3) for emitting the blue light, the constructive interference may occur in the same degree of the antinode, and more particularly, in the first antinode. In the case of the first subpixel (P1) for emitting the red light, the constructive interference may occur in the different degree of the antinode from that of the second and third subpixels (P2, P3), and more particularly, in the second antinode. Accordingly, the light with the red wavelength range corresponding to the range of 610 nm to 630 nm and the light with the cyan wavelength range corresponding to the range of 475 nm to 505 nm may be emitted from the first subpixel (P1), the light with the green wavelength range corresponding to the range of 510 nm to 540 nm may be emitted from the second subpixel (P2), and the light with the blue wavelength range corresponding to the range of 450 nm to 470 nm may be emitted from the third subpixel (P3).

Also, according to an embodiment of the present invention, the light-absorbing layer 800 may not absorb the light with the red wavelength range, the light with the green wavelength range, and the light with the blue wavelength range, but may absorb the light with the cyan wavelength range. Thus, the light-absorbing layer 800 may not be patterned for each subpixel (P1, P2, P3), but may be provided as one contiguous body in the respective subpixels (P1, P2, P3) and in the boundaries between the respective subpixels, to reduce or prevent the cyan light from being emitted from the first subpixel (P1).

Figure 8:
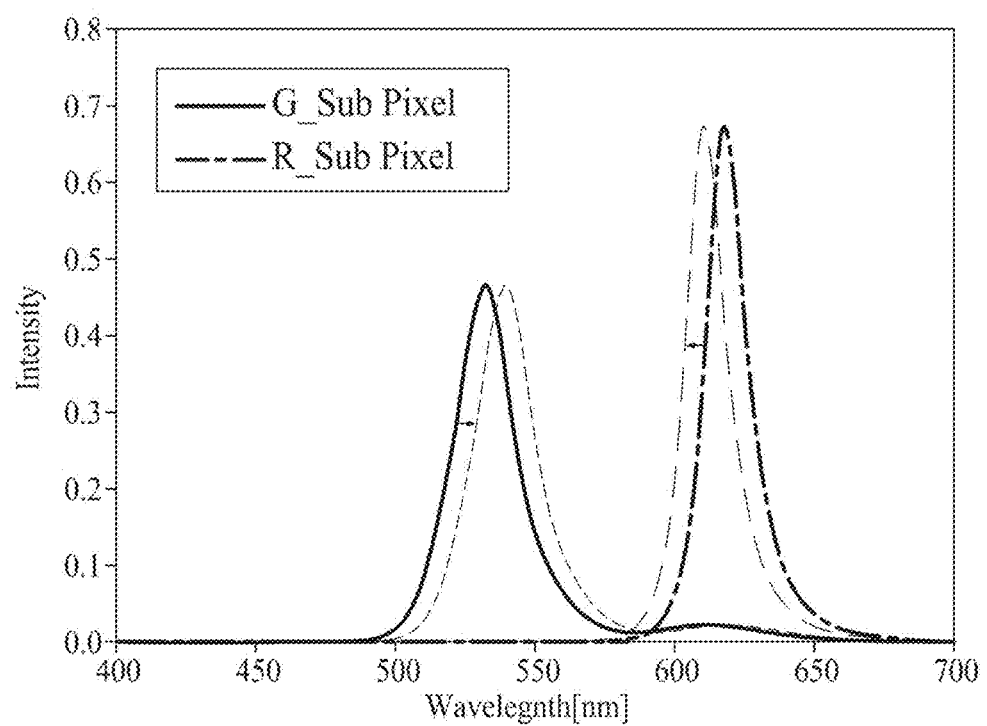
FIG. 8 is a graph illustrating a shift of light wavelength in accordance with a viewing angle in the electroluminescent display device according to an embodiment of the present disclosure.

FIG. 8 is a graph illustrating a shift of light wavelength in accordance with a viewing angle in the electroluminescent display device according to an embodiment of the present disclosure.

FIG. 8 illustrates a shift of light wavelength in accordance with a viewing angle in the first subpixel of the red color in which the emission layer is positioned at the second antinode, and the second subpixel of the green color in which the emission layer is positioned at the first antinode. In a front viewing angle expressed by a thick curved line, a shift of the light wavelength may not be generated. In a lateral viewing angle expressed by a thin dotted curved line, a shift of the light wavelength may be generated. For example, in accordance with the increase of viewing angle, yellow light with a wavelength range of 550 nm to 600 nm may be emitted from the first subpixel (P1) while being partially mixed with the red light from the first subpixel (P1), and yellow light with a wavelength range of 550 nm to 600 nm may be emitted from the second subpixel (P2) while being partially mixed with the green light from the second subpixel (P2).

Thus, according to an embodiment of the present disclosure, the light-absorbing layer 800 may include an additional material capable of absorbing the yellow light with the wavelength range of 550 nm to 600 nm, to reduce or prevent the yellow light form being emitted from the first subpixel (P1) or the second subpixel (P2).

In the aspect of wavelength range, the yellow light with the wavelength range of 550 nm to 600 nm may not overlap the light emitted from each subpixel (P1, P2, P3), and the light-absorbing layer 800 may not be patterned for each subpixel (P1, P2, P3), and may be formed as one contiguous body in the respective subpixels (P1, P2, P3) and the boundaries between the respective subpixels.

Figure 9A:
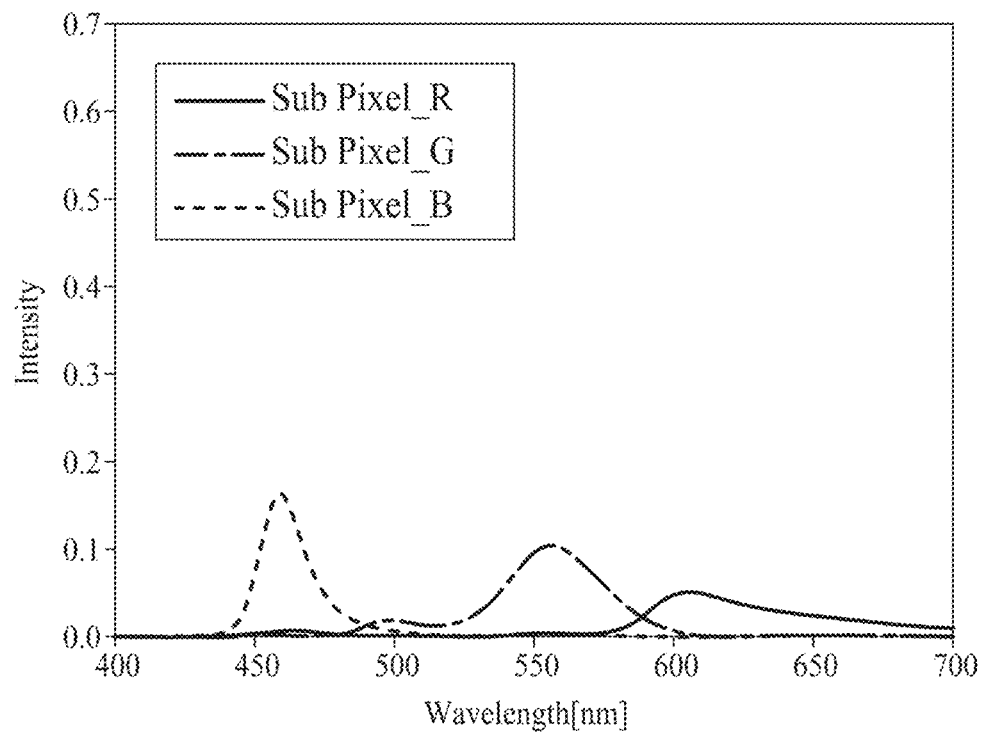
FIG. 9A is a graph illustrating a light intensity by each wavelength range in an electroluminescent display device with a color filter provided for each subpixel according to the related art.
Figure 9B:
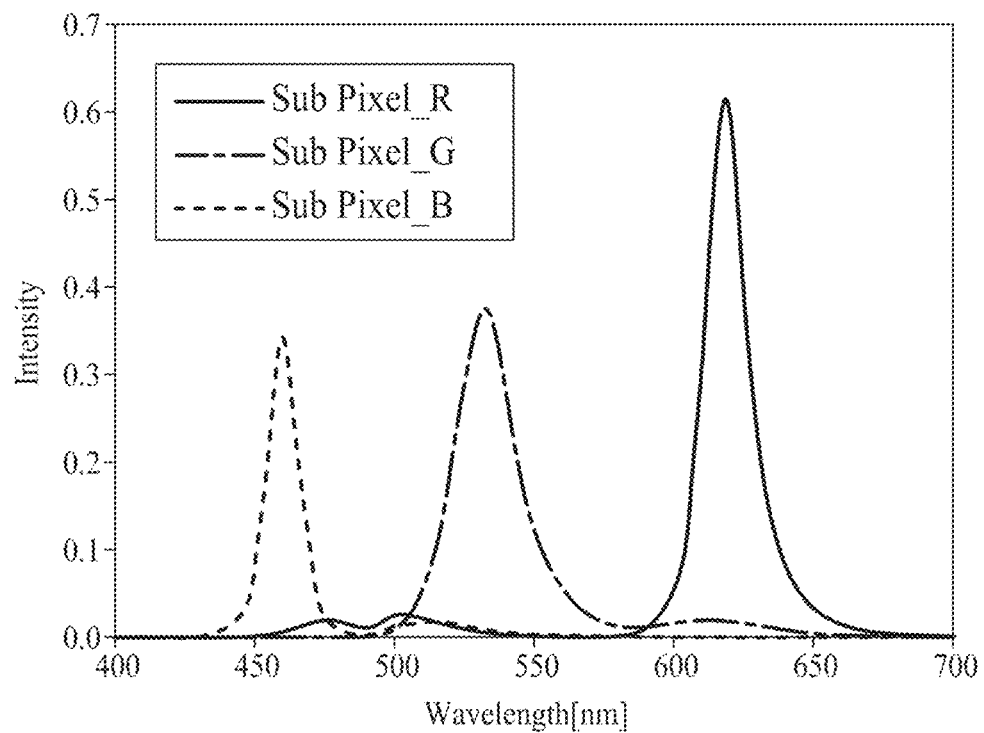
FIG. 9B is a graph illustrating a light intensity by each wavelength range in an electroluminescent display device with a light-absorbing layer according to an embodiment of the present disclosure.

FIG. 9A is a graph illustrating a light intensity by each wavelength range in an electroluminescent display device with a color filter provided for each subpixel according to the related art. FIG. 9B is a graph illustrating a light intensity by each wavelength range in an electroluminescent display device with a light-absorbing layer according to an embodiment of the present disclosure.

As shown in FIG. 9A, in the case of the electroluminescent display device according to the related art, a large amount of light may be absorbed in the color filter while light passes through the color filter patterned for each subpixel, and the light intensity of each of red (R) color, green (G) color, and blue (B) color may be decreased for each subpixel. In the case of FIG. 9A, a panel efficiency (Cd/A) may be only 11.4.

FIG. 9B shows that a light-absorbing layer may include a material capable of absorbing light with a wavelength range of a cyan color. As shown in FIG. 9B, the light-absorbing layer in the electroluminescent display device according to an embodiment of the present disclosure may absorb only the light with the unnecessary wavelength range, for example, the cyan light, and the light intensity of each of red (R) color, green (G) color, and blue (B) color may be increased for each subpixel. In the example of FIG. 9B, a panel efficiency (Cd/A) may be 30.3, which is relatively higher than that of the related art of FIG. 9A.

Figure 10A:
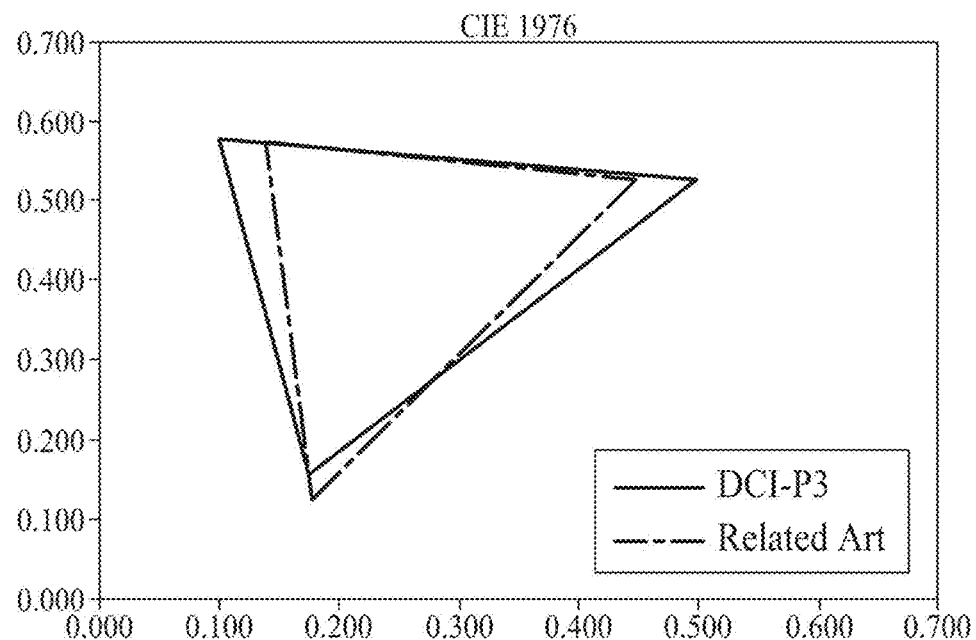
FIG. 10A illustrates color coordinates of the electroluminescent display device with the color filter provided for each subpixel according to the related art.
Figure 10B:
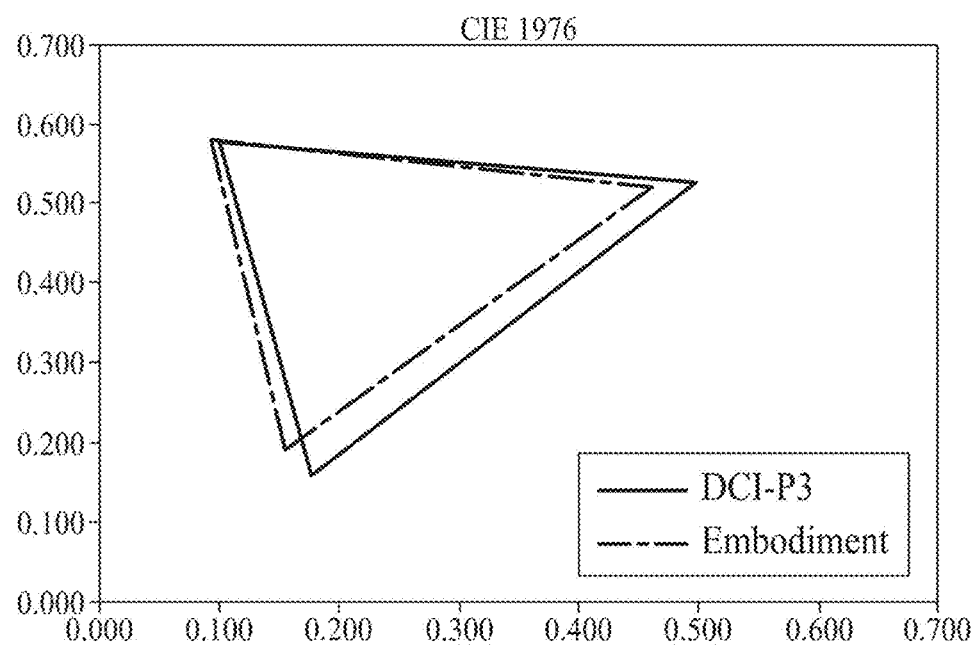
FIG. 10B illustrates color coordinates of the electroluminescent display device with the light-absorbing layer according to an embodiment of the present disclosure.

FIG. 10A illustrates color coordinates of the electroluminescent display device with the color filter provided for each subpixel according to the related art. FIG. 10B illustrates color coordinates of the electroluminescent display device with the light-absorbing layer according to an embodiment of the present disclosure.

FIG. 10A shows 82% of color realization ratio for the standard color coordinates (DCI-P3) of the CIE 1976 L*, u*, v* color space ("CIE 1976"). FIG. 10B shows 81% of color realization ratio for the standard color coordinates (DCI-P3) of CIE 1976. FIG. 10B shows that the light-absorbing layer may include materials capable of absorbing light with a wavelength range of a cyan color and light with a wavelength range of a yellow color. Accordingly, even though the color filter may not be patterned for each subpixel in the electroluminescent display device according to an embodiment of the present disclosure, it may be possible to realize the color realization ratio, which may be similar to that of the electroluminescent display device with the color filter provided for each subpixel according to the related art.

Figure 11:
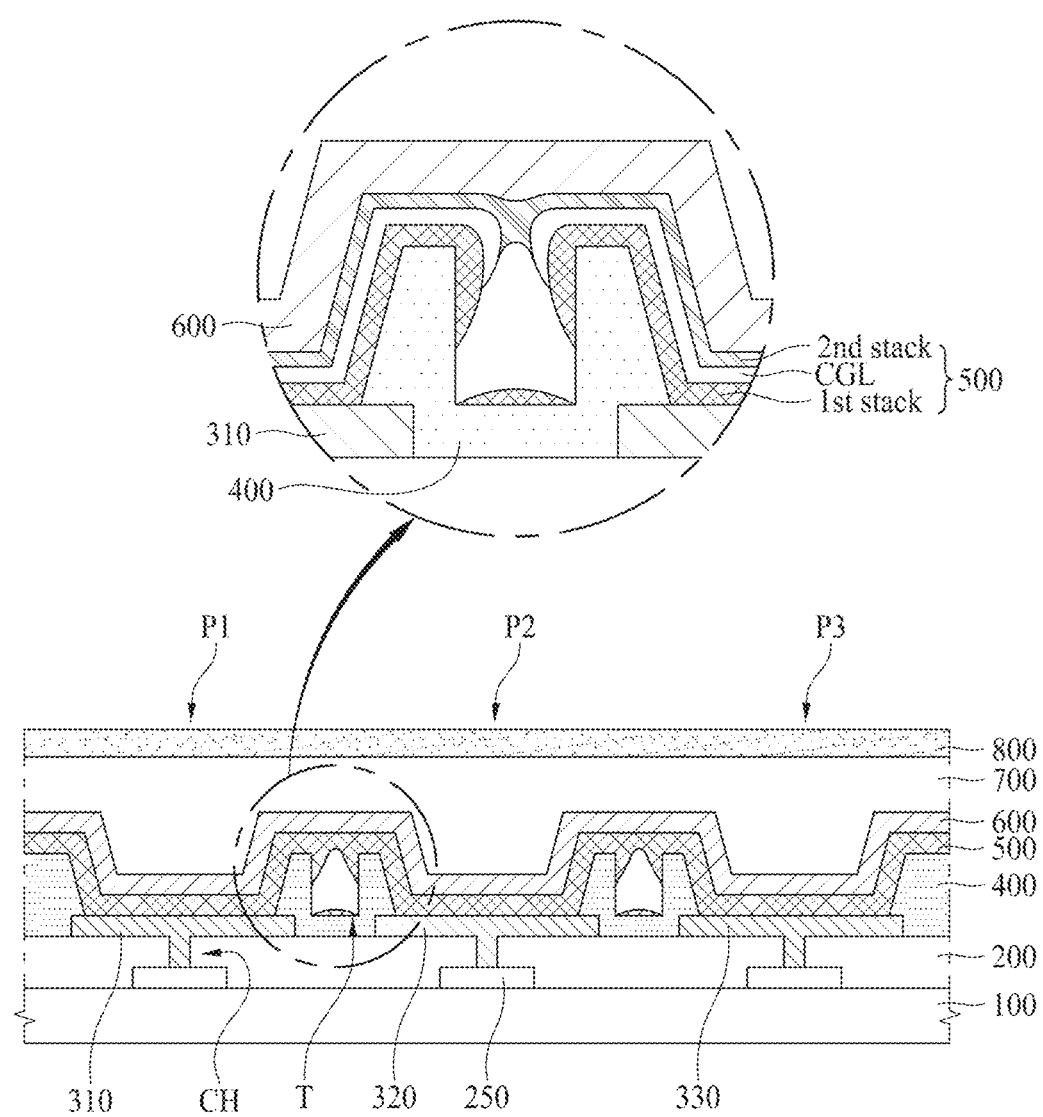
FIG. 11 is a cross-sectional view illustrating an electroluminescent display device according to an embodiment of the present disclosure.

FIG. 11 is a cross-sectional view illustrating an electroluminescent display device according to an embodiment of the present disclosure.

A trench (T) may be additionally provided in a bank 400 of the electroluminescent display device of FIG. 11, and the electroluminescent display device of the FIG. 11 example may be different from the electroluminescent display device of the FIG. 1 example. Accordingly, the same reference numbers will be used throughout the drawings to refer to the same or like parts, and only the different structures will be described. As shown in FIG. 11, a trench (T) may be formed in a bank 400 along a boundary between subpixels (P1, P2, P3).

According to an embodiment of the present disclosure, the trench (T) may be formed in the bank 400, and an emission layer 500 may be formed in the trench (T). Thus, a long current path may be formed between the neighboring subpixels (P1, P2, P3), to reduce or prevent a leakage current from being generated between the neighboring subpixels (P1, P2, P3). For example, on the presumption that an interval between the subpixels (P1, P2, P3) becomes compact to realize a high resolution, if the emission layer 500 inside any one of the subpixels (P1, P2, P3) emits light, charges of the corresponding emission layer 500 may be transferred to another emission layer 500 of neighboring another subpixel (P1, P2, P3), and there may be a possibility of leakage current.

Thus, according to an embodiment of the present disclosure, the trench (T) may be formed in the boundary between the subpixels (P1, P2, P3), and the emission layer 500 may be formed in the trench (T) so that a resistance may be increased due to the long current path formed between the neighboring subpixels (P1, P2, P3), to thereby reduce a leakage current. For example, with reference to an expanded view of FIG. 11, the emission layer 500 may include a first stack ($1^{st}$ stack), a second stack ($2^{nd}$ stack), and a charge generating layer (CGL) between the first stack ($1^{st}$ stack) and the second stack ($2^{nd}$ stack).

The first stack ($1^{st}$ stack) may be on an inner lateral surface of the trench (T), and may be on an inner lower surface of the trench (T). For example, some area of the first stack ($1^{st}$ stack) on the inner lateral surface of the trench (T) may be noncontiguous (e.g., disconnected) from some area of the first stack ($1^{st}$ stack) on the inner lower surface of the trench (T). Thus, some area of the first stack ($1^{st}$ stack) on one lateral surface inside the trench (T), and more particularly, on the left lateral surface inside the trench (T), may be noncontiguous (e.g., may not be connected) to some area of the first stack ($1^{st}$ stack) on the other lateral surface inside the trench (T), and more particularly, on the right lateral surface inside the trench (T). Accordingly, charges may not be transferred between the subpixels (P1, P2, P3) arranged with the trench (T) interposed therebetween through the first stack ($1^{st}$ stack). It should be appreciated that the terms "left" and "right" are used herein for convenience of description, and are interchangeable, as would be understood by one of ordinary skill in the art.

Also, the charge generating layer (CGL) may be formed at the inner lateral surface of the trench (T), and may be on the first stack ($1^{st}$ stack). For example, some area of the charge generating layer (CGL) on one lateral surface inside the trench (T), and more particularly, on the left lateral surface inside the trench (T), may be noncontiguous (e.g., may not be connected) to some area of the charge generating layer (CGL) on the other lateral surface inside the trench (T), and more particularly, on the right lateral surface inside the trench (T). Accordingly, charges may not be transferred between the subpixels (P1, P2, P3), arranged with the trench (T) interposed therebetween, through the charge generating layer (CGL).

Also, the second stack ($2^{nd}$ stack) may be contiguous (e.g., may be provided connectedly) between the neighboring subpixels (P1, P2, P3) with the trench (T) interposed therebetween, and may be on the charge generating layer (CGL). Thus, charges may be transferred between the subpixels (P1, P2, P3), with the trench (T) interposed therebetween, through the second stack ($2^{nd}$ stack), but embodiments are not limited to this structure. For example, the second stack ($2^{nd}$ stack) may be noncontiguous (e.g., may be provided disconnectedly) between the neighboring subpixels (P1, P2, P3), with the trench (T) interposed therebetween, by appropriately adjusting a shape of the trench (T) and a deposition process of the emission layer 500.

Conductivity of the charge generating layer (CGL) may be higher than that of each of the first stack ($1^{st}$ stack) and the second stack ($2^{nd}$ stack). For example, an N-type charge generating layer of the charge generating layer (CGL) may include a metal material, and conductivity of the charge generating layer (CGL) may be higher than that of each of the first stack ($1^{st}$ stack) and the second stack ($2^{nd}$ stack). Thus, the charge transfer between the subpixels (P1, P2, P3), which may be adjacent to each other, may be made through the charge generating layer (CGL), and any charge transfer through the second stack ($2^{nd}$ stack) may be insignificant.

Thus, according to an embodiment of the present disclosure, when the emission layer 500 is formed inside the trench (T), some of the emission layer 500 may be noncontiguous (e.g., may be disconnectedly provided). For example, the first stack ($1^{st}$ stack) and the charge generating layer (CGL) may be noncontiguous (e.g., may be provided disconnectedly) so that it may be possible to reduce the charge transfer between the subpixels (P1, P2, P3), which may be adjacent to each other, to reduce or prevent a leakage current.

According to an embodiment of the present disclosure, when white light is emitted from the emission layer, the micro-cavity property may be realized for each subpixel. The light with the red wavelength range and the light with the cyan wavelength range may be emitted from the first subpixel, the light with the green wavelength range may be emitted from the second subpixel, and the light with the blue wavelength range may be emitted from the third subpixel.

Also, according to an embodiment of the present disclosure, even is the light-absorbing layer including the material capable of absorbing the light with the cyan wavelength range is formed as one contiguous body in the respective first to third subpixels and the boundary area between each of the first to third subpixels, light with a desired wavelength range may be emitted from each individual subpixel. Thus, unlike the related art, the electroluminescent display device according to an embodiment of the present disclosure may be advantageous in that it may be unnecessary to pattern the color filter for each subpixel.

Figure 12A:
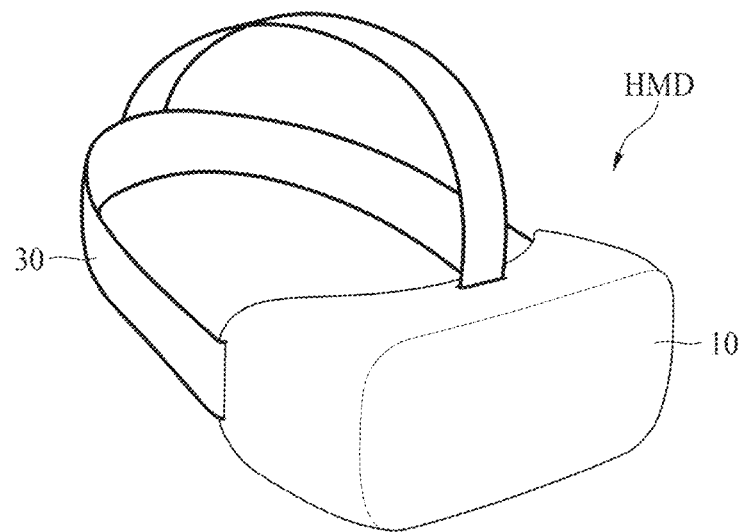
FIGS. 12A to 12C illustrate an electroluminescent display device according to an embodiment of the present disclosure, which relate to a head mounted display (HMD) device.
Figure 12B:
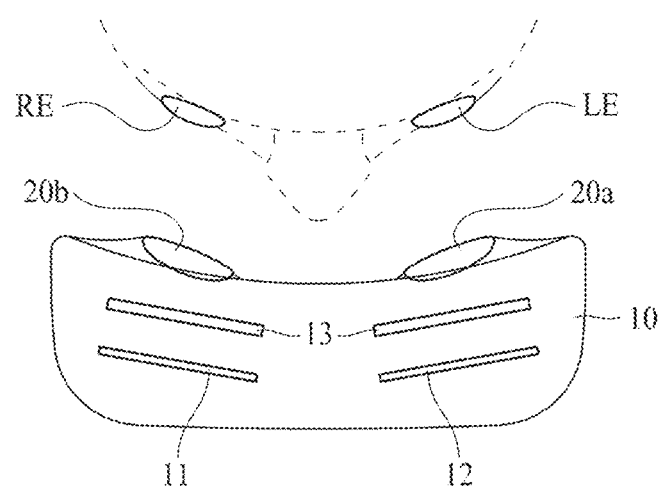
Figure 12C:
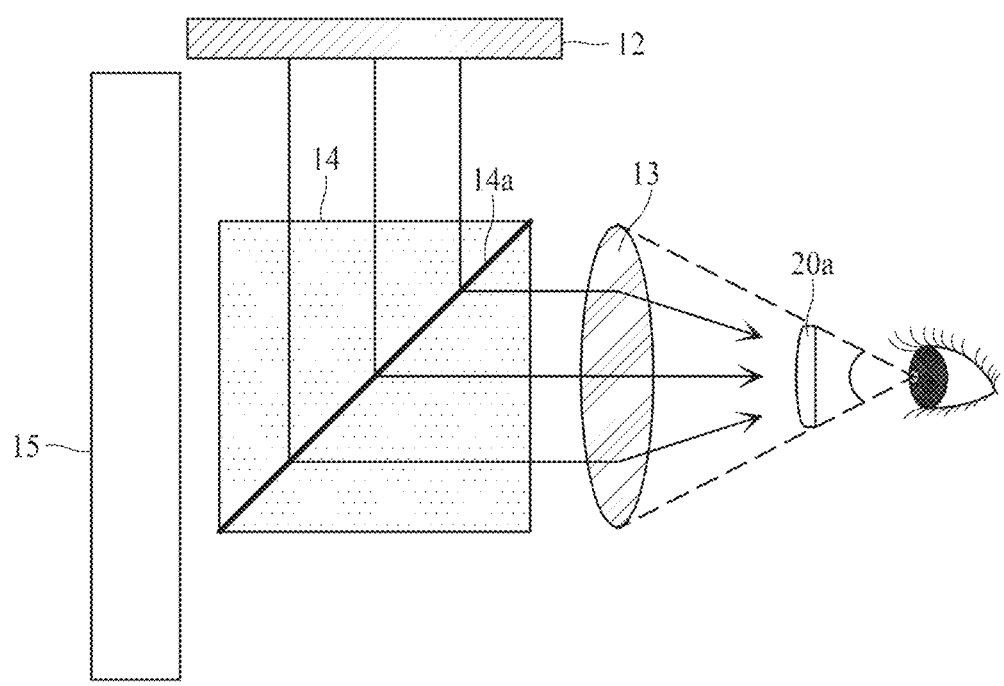

FIGS. 12A to 12C illustrate examples of an electroluminescent display device according to an embodiment of the present disclosure, which relate with a head-mounted display (HMD) device.

FIG. 12A is a perspective view, FIG. 12B is a plane view of a virtual reality (VR) structure, and FIG. 12C is a cross-sectional view of an augmented reality (AR) structure. As shown in FIG. 12A, the head-mounted display (HMD) device according to an embodiment of the present disclosure may include a receiving case 10 and a head-mounted band 30.

A display device, a lens array, and an ocular eyepiece may be received (e.g., may be accommodated) in the inside of the receiving case 10. The head-mounted band 30 may be fixed to the receiving case 10. In the drawings, the head-mounted band 30 may be illustrated as being configured to surround an upper surface and both lateral surfaces in a user's head, but embodiments may not be limited to this structure. For example, the head-mounted band may be provided to fix the head-mounted display (HMD) device to a user's head, which may be substituted, e.g., by an eyeglass-frame shape or a helmet-shaped structure.

As shown in FIG. 12B, the head-mounted display (HMD) device of the virtual reality (VR) structure according to an embodiment of the present disclosure may include a left-eye display device 12, a right-eye display device 11, a lens array 13, a left-eye ocular eyepiece 20a, and a right-eye ocular eyepiece 20b. The left-eye display device 12, the right-eye display device 11, the lens array 13, and the left-eye ocular eyepiece 20a, and the right-eye ocular eyepiece 20b may be received in the receiving case 10.

The same image may be displayed on the left-eye display device 12 and the right-eye display device 11. For example, a user can watch a two-dimensional (2D) image. If an image for a left eye were displayed on the left-eye display device 12, and an image for a right eye were displayed on the right-eye display device 11, a user can watch a three-dimensional (3D) image. Each of the left-eye display device 12 and the right-eye display device 11 may include the display device shown in any of the examples of FIGS. 1 to 11. For example, an upper portion corresponding to a surface for displaying an image in any of the examples of FIGS. 1 to 11, e.g., the light-absorbing layer 800, may confront or face the lens array 13.

The lens array 13 may be between the left-eye ocular eyepiece 20a and the left-eye display device 12, while being spaced apart from each of the left-eye ocular eyepiece 20a and the left-eye display device 12. For example, the lens array 13 may be positioned at the front of the left-eye ocular eyepiece 20a and at the rear of the left-eye display device 12. Also, the lens array 13 may be between the right-eye ocular eyepiece 20b and the right-eye display device 11, while being apart from each of the right-eye ocular eyepiece 20b and the right-eye display device 11. For example, the lens array 13 may be positioned at the front of the right-eye ocular eyepiece 20b and at the rear of the right-eye display device 11.

The lens array 13 may be a micro lens array. The lens array 13 may be substituted by a pin hole array. Due to the lens array 13, an image displayed on the left-eye display device 12 or the right-eye display device 11 may be expanded and perceived by a user. A user's left eye (LE) may be positioned at the left-eye ocular eyepiece 20a, and a user's right eye (RE) may be positioned at the right-eye ocular eyepiece 20b.

As shown in FIG. 12C, the head-mounted display (HMD) device of the augmented reality (AR) structure according to an embodiment of the present disclosure may include a left-eye display device 12, a lens array 13, a left-eye ocular eyepiece 20a, a transmissive reflecting portion 14, and a transmission window 15. For convenience of explanation, FIG. 12C illustrates only the left-eye structure. The right-eye structure may be substantially similar in structure to the left-eye structure, as should be understood to one of ordinary skill in the art.

The left-eye display device 12, the lens array 13, the left-eye ocular eyepiece 20a, the transmissive reflecting portion 14, and the transmission window 15 may be received (e.g., may be accommodated) in the receiving case 10. The left-eye display device 12 may be disposed at one side of the transmissive reflecting portion 14, for example, an upper side of the transmissive reflecting portion 14, without covering the transmission window 15. Accordingly, an image may be provided to the transmissive reflecting portion 14, under the condition that an ambient background seen through the transmission window 15 may not be covered by the left-eye display device 12.

The left-eye display device 12 may include the display device shown in any of the examples of FIGS. 1 to 11. For example, an upper portion corresponding to a surface for displaying an image in any of the examples of FIGS. 1 to 11, e.g., the color filter layer 900, may confront the transmissive reflecting portion 14.

The lens array 13 may be provided between the left-eye ocular eyepiece 20a and the transmissive reflecting portion 14. A user's left eye may be positioned at the left-eye ocular eyepiece 20a.

The transmissive reflecting portion 14 may be between the lens array 13 and the transmission window 15. The transmissive reflecting portion 14 may include a reflection surface 14a, which may partially transmit some light, and may also reflect the remaining light. The reflection surface 14a may be configured to guide an image, which may be displayed on the left-eye display device 12, toward the lens array 13. Thus, a user can watch an image displayed on the left-eye display device 12 together with the ambient background through the transmission window 15. For example, a user can watch one image obtained by a virtual image overlaid with the ambient real background, e.g., to realize an augmented reality (AR). The transmission window 15 may be disposed in front of the transmissive reflecting portion 14.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An electroluminescent display device, comprising:
a substrate comprising:
a first subpixel;
a second subpixel; and
a third subpixel;
a first electrode in each of the first to third subpixels on the substrate;
an emission layer on the first electrode and comprising:
a first stack configured to emit first-colored light; and
a second stack configured to emit second-colored light, the second stack being on the first stack;
a second electrode on the emission layer; and
a light-absorbing layer on the second electrode,
wherein the first subpixel is configured to emit:
light with a red wavelength range, and
light with a cyan wavelength range,
wherein the second subpixel is configured to emit light with a green wavelength range,
wherein the third subpixel is configured to emit light with a blue wavelength range, and
wherein the light-absorbing layer comprises a cyan-absorbing material configured to absorb the light with the cyan wavelength range.

2. The electroluminescent display device of claim 1, wherein the light-absorbing layer is formed as one contiguous body across all of: the first subpixel, the second subpixel, the third subpixel, and a boundary area between each of the first to third subpixels.

3. The electroluminescent display device of claim 1, wherein the light-absorbing layer additionally comprises a yellow-absorbing material configured to absorb light with a yellow wavelength range.

4. The electroluminescent display device of claim 3, wherein:
the cyan-absorbing material configured to absorb light with the cyan wavelength range is configured to absorb light with a wavelength range of 475 nm to 505 nm; and
the yellow-absorbing material configured to absorb light with the yellow wavelength range is configured to absorb light with a wavelength range of 550 nm to 600 nm.

5. The electroluminescent display device of claim 1, wherein:
the light with the red wavelength range comprises:
a peak wavelength within a range of 610 nm to 630 nm; and
a full width at half maximum (WHAM) within a range of 20 nm to 30 nm;
the light with the green wavelength range comprises:
a peak wavelength within a range of 510 nm to 540 nm; and
a full width at half maximum (FWHM) within a range of 30 nm to 40 nm;
the light with the blue wavelength range comprises:
a peak wavelength within a range of 450 nm to 470 nm; and
a full width at half maximum (FWHM) within a range of 20 nm to 30 nm; and
the light with the cyan wavelength range comprises a peak wavelength within a range of 475 nm to 505 nm.

6. The electroluminescent display device of claim 1, wherein:
the first electrode comprises a lower electrode comprising a reflective electrode;
the second electrode comprises a semi-transparent electrode,
a distance between the second electrode and the lower electrode in the first subpixel is configured to emit the light with the red wavelength range at a high light intensity in comparison to respective light intensities of the light with cyan, green, and blue wavelength ranges;
a distance between the second electrode and the lower electrode in the second subpixel is configured to emit the light with the green wavelength range at a high light intensity in comparison to respective light intensities of the light with red, green, and blue wavelength ranges; and
a distance between the second electrode and the lower electrode in the third subpixel is configured to emit the light with the blue wavelength range at a high light intensity in comparison to respective light intensities of the light with red, green, and cyan wavelength ranges.

7. The electroluminescent display device of claim 6, wherein:
the second subpixel and the third subpixel are configured to generate a constructive interference at a same first antinode; and
the first subpixel is configured to generate a constructive interference at a second antinode different from the first antinode of the second subpixel and the third subpixel.

8. The electroluminescent display device of claim 1, further comprising:
a bank covering an end of the first electrode,
wherein the bank is provided with a trench in a boundary area between each of the first to third subpixels, and
wherein the emission layer is inside the trench.

9. The electroluminescent display device of claim 8, wherein some of the emission layer has a noncontiguous structure in the trench.

10. The electroluminescent display device of claim 1, further comprising:
a lens array spaced apart from the substrate; and
a receiving case configured to accommodate the substrate and the lens array therein.

11. The electroluminescent display device of claim 1, wherein:
the first electrode in the first subpixel comprises:
a first lower electrode comprising a reflective electrode;
a first upper electrode on the first lower electrode; and
a first dielectric layer between the first lower electrode and the first upper electrode;
the first electrode in the second subpixel comprises:
a second lower electrode comprising a reflective electrode;
a second upper electrode on the second lower electrode; and
a second dielectric layer between the second lower electrode and the second upper electrode;
the first electrode in the third subpixel comprises:
a third lower electrode comprising a reflective electrode; and
a third upper electrode on the third lower electrode; and
a distance from a lower surface of the first upper electrode to a lower surface of the second electrode, a distance from a lower surface of the second upper electrode to the lower surface of the second electrode, and a distance from a lower surface of the third upper electrode to the lower surface of the second electrode are identical to one another.

12. The electroluminescent display device of claim 11, wherein the distance from the lower surface of the first upper electrode to the lower surface of the second electrode is within a range of 1800 Å to 2300 Å.

13. The electroluminescent display device of claim 11, wherein:
the first stack comprises a blue emitting layer;
the second stack comprises a red emitting layer and a green emitting layer;
a distance from the lower surface of the first upper electrode to an upper surface of the blue emitting layer is within a range of 420 Å to 520 Å;
a distance from the lower surface of the first upper electrode to an upper surface of the red emitting layer is within a range of 1200 Å to 1500 Å; and
a distance from the lower surface of the first upper electrode to an upper surface of the green emitting layer is within a range of 1400 Å to 1750 Å.

14. The electroluminescent display device of claim 11, wherein:
the first stack comprises a blue emitting layer;
the second stack comprises a yellow-green emitting layer;
a distance from the lower surface of the first upper electrode to an upper surface of the blue emitting layer is within a range of 420 Å to 520 Å; and
a distance from the lower surface of the first upper electrode to an upper surface of the yellow-green emitting layer is within a range of 1350 Å to 1650 Å.

15. An electroluminescent display device comprising:
a substrate comprising:
a first subpixel;
a second subpixel; and
a third subpixel;
a first electrode in each of the first to third subpixels on the substrate, the first electrode comprising a reflective electrode;
an emission layer on the first electrode, the emission layer being configured to emit white light;
a second electrode on the emission layer, the second electrode comprising a semi-transparent electrode; and
a light-absorbing layer on the second electrode and formed as one contiguous body across all of: the first subpixel, the second subpixel, the third subpixel, and a boundary area between each of the first to third subpixels,
wherein the first subpixel is configured to emit light with a peak wavelength of a first wavelength range and light with a peak wavelength of a second wavelength range,
wherein the second subpixel is configured to emit light with a peak wavelength of a third wavelength range,
wherein the third subpixel is configured to emit light with a peak wavelength of a fourth wavelength range, and
wherein the light-absorbing layer comprises a material in which a light-absorbing ratio of the first wavelength range is higher than a respective light-absorbing ratio of each of the second wavelength range, the third wavelength range, and the fourth wavelength range.

16. The electroluminescent display device of claim 15, wherein:
a distance between the reflective electrode and the semi-transparent electrode in the first subpixel is configured to emit the light with the second wavelength range at a high light intensity in comparison to respective light intensities of the light with the first, third, and fourth wavelength ranges;
a distance between the reflective electrode and the semi-transparent electrode in the second subpixel is configured to emit the light with the third wavelength range at a high light intensity in comparison to respective light intensities of the light with the first, second, and fourth wavelength ranges;
a distance between the reflective electrode and the semi-transparent electrode in the third subpixel is designed to emit the light with the fourth wavelength range at a range at a high light intensity in comparison to respective light intensities of the light with the first, second, and third wavelength ranges;
the light with the first wavelength range has a peak wavelength within a range of 475 nm to 505 nm;
the light with the second wavelength range has a peak wavelength within a range of 610 nm to 630 nm;
the light with the third wavelength range has a peak wavelength within a range of 510 nm to 540 nm; and
the light with the fourth wavelength range has a peak wavelength within a range of 450 nm to 470 nm.

17. The electroluminescent display device of claim 16, wherein the light-absorbing layer additionally comprises a material configured to absorb light within a range of 550 nm to 600 nm, between the third wavelength range and the fourth wavelength range.

18. The electroluminescent display device of claim 15, further comprising:
a bank covering an end of the first electrode,
wherein the bank is provided with a trench in the boundary area between each of the first to third subpixels, and
wherein the emission layer is inside the trench.

19. The electroluminescent display device of claim 18, wherein:
the emission layer comprises a charge generating layer; and
the charge generating layer has a noncontiguous structure in the trench.

20. The electroluminescent display device of claim 15, further comprising:
a lens array spaced apart from the substrate; and
a receiving case configured to accommodate the substrate and the lens array therein.

* * * * *